United States Patent
Chen et al.

(10) Patent No.: US 9,939,978 B2
(45) Date of Patent: Apr. 10, 2018

(54) TOUCH SENSITIVE DISPLAYS

(71) Applicant: Apple Inc., Cupertino, CA (US)

(72) Inventors: Wei Chen, Palo Alto, CA (US); Steven P. Hotelling, Los Gatos, CA (US); John Z. Zhong, Saratoga, CA (US); Shih-Chang Chang, Cupertino, CA (US); Stephen S. Poon, San Jose, CA (US)

(73) Assignee: Apple Inc, Cupertino, CA (US)

( * ) Notice: Subject to any disclaimer, the term of this patent is extended or adjusted under 35 U.S.C. 154(b) by 0 days.

(21) Appl. No.: 15/195,852

(22) Filed: Jun. 28, 2016

(65) Prior Publication Data

US 2016/0306468 A1    Oct. 20, 2016

Related U.S. Application Data

(62) Division of application No. 13/186,238, filed on Jul. 19, 2011, now Pat. No. 9,400,576.

(51) Int. Cl.
*G06F 3/044* (2006.01)
*G06F 1/16* (2006.01)
(Continued)

(52) U.S. Cl.
CPC ............ *G06F 3/044* (2013.01); *G06F 1/1601* (2013.01); *G06F 1/1643* (2013.01); *G06F 3/047* (2013.01);
(Continued)

(58) Field of Classification Search
USPC .................................................... 345/76–82
See application file for complete search history.

(56) References Cited

U.S. PATENT DOCUMENTS

| 4,066,855 A | 1/1978 | Zenk |
|---|---|---|
| 4,085,302 A | 4/1978 | Zenk et al. |

(Continued)

FOREIGN PATENT DOCUMENTS

| CN | 2927238 Y | 7/2007 |
|---|---|---|
| CN | 101893973 A | 11/2010 |

(Continued)

OTHER PUBLICATIONS

Takamatsu et al., "Transparent conductive-polymer strain sensors for touch input sheets of flexible displays" Journal of Micromechanics and Microengineering, J. Micromech. Microeng. 20 (2010) 075017 (6pp).

(Continued)

*Primary Examiner* — Gustavo Polo
(74) *Attorney, Agent, or Firm* — Treyz Law Group, P.C.; G. Victor Treyz; Zachary D. Hadd

(57) ABSTRACT

Displays such as organic light-emitting diode displays may be provided with touch sensing capabilities. A touch sensor may be formed from electrodes located on a thin-film encapsulation layer or one or more sides of a polarizer. A single-sided or double-sided touch sensor panel may be attached to the upper or lower surface of a polarizer. Control circuitry may be used to provide control signals to light-emitting diodes in the display using a grid of control lines. The control lines and transparent electrode structures such as indium tin oxide structures formed on a thin-film encapsulation layer or polarizer may be used as electrodes for a touch sensor. Displays may have active regions and inactive peripheral portions. The displays may have edge portions that are bent along a bend axis that is within the active region to form a borderless display. Virtual buttons may be formed on the bent edge portions.

12 Claims, 33 Drawing Sheets

(51) Int. Cl.
*G06F 3/041* (2006.01)
*G06F 3/047* (2006.01)
*H01L 27/32* (2006.01)
*H01L 51/52* (2006.01)
*G06F 3/0488* (2013.01)

(52) U.S. Cl.
CPC .......... *G06F 3/0412* (2013.01); *G06F 3/0416* (2013.01); *H01L 27/323* (2013.01); *H01L 27/3276* (2013.01); *H01L 27/3288* (2013.01); *H01L 51/5246* (2013.01); *H01L 51/5253* (2013.01); *H01L 51/5281* (2013.01); *H01L 51/5284* (2013.01); *G06F 3/04886* (2013.01); *G06F 2203/04112* (2013.01); *H01L 27/3293* (2013.01); *H01L 51/5237* (2013.01); *H01L 2251/5338* (2013.01)

(56) References Cited

U.S. PATENT DOCUMENTS

| | | |
|---|---|---|
| 5,483,261 A | 1/1996 | Yasutake |
| 5,488,204 A | 1/1996 | Mead et al. |
| 5,825,352 A | 10/1998 | Bisset et al. |
| 5,835,079 A | 11/1998 | Shieh |
| 5,880,411 A | 3/1999 | Gillespie et al. |
| 6,067,074 A | 5/2000 | Lueders |
| 6,188,391 B1 | 2/2001 | Seely et al. |
| 6,310,610 B1 | 10/2001 | Beaton et al. |
| 6,323,846 B1 | 11/2001 | Westerman et al. |
| 6,690,387 B2 | 2/2004 | Zimmerman et al. |
| 6,803,245 B2 | 10/2004 | Auch et al. |
| 6,879,319 B2 | 4/2005 | Cok |
| 7,015,894 B2 | 3/2006 | Morohoshi |
| 7,034,913 B2 | 4/2006 | Ishida |
| 7,184,064 B2 | 2/2007 | Zimmerman et al. |
| 7,188,989 B2 | 3/2007 | Miyashita |
| 7,324,093 B1 | 1/2008 | Gettemy et al. |
| 7,541,671 B2 | 6/2009 | Foust et al. |
| 7,663,607 B2 | 2/2010 | Hotelling et al. |
| 7,714,801 B2 | 5/2010 | Kimmel |
| 7,834,451 B2 | 11/2010 | Lee et al. |
| RE42,199 E | 3/2011 | Caldwell |
| 7,912,508 B2 | 3/2011 | Lee et al. |
| 7,920,223 B2 | 4/2011 | Nishizawa et al. |
| 8,723,824 B2 | 5/2014 | Myers et al. |
| 8,724,304 B2 | 5/2014 | Raff et al. |
| 8,787,016 B2 | 7/2014 | Rothkopf et al. |
| 8,804,347 B2 | 8/2014 | Martisauskas |
| 8,816,977 B2 | 8/2014 | Rothkopf et al. |
| 8,929,085 B2 | 1/2015 | Franklin et al. |
| 8,934,228 B2 | 1/2015 | Franklin et al. |
| 8,947,627 B2 | 2/2015 | Rappoport et al. |
| 9,098,242 B2 | 8/2015 | Rappoport et al. |
| 9,178,970 B2 | 11/2015 | Lynch |
| 2002/0001187 A1 | 1/2002 | Murofushi |
| 2003/0227441 A1 | 12/2003 | Hioki et al. |
| 2005/0025330 A1 | 2/2005 | Saiki et al. |
| 2005/0140646 A1 | 6/2005 | Nozawa |
| 2006/0026521 A1 | 2/2006 | Hotelling et al. |
| 2006/0132025 A1 | 6/2006 | Gao et al. |
| 2006/0197753 A1 | 9/2006 | Hotelling |
| 2006/0238494 A1 | 10/2006 | Narayanaswami et al. |
| 2007/0202917 A1 | 8/2007 | Phelps et al. |
| 2007/0242033 A1 | 10/2007 | Cradick et al. |
| 2007/0247422 A1 | 10/2007 | Vertegaal et al. |
| 2007/0258604 A1 | 11/2007 | Bosnecker |
| 2008/0062139 A1 | 3/2008 | Hotelling et al. |
| 2008/0211395 A1 | 9/2008 | Koshihara et al. |
| 2008/0224971 A1 | 9/2008 | Utsunomiya et al. |
| 2008/0305838 A1 | 12/2008 | Joo |
| 2009/0015747 A1 | 1/2009 | Nishizawa et al. |
| 2009/0082103 A1 | 3/2009 | Lube |
| 2009/0161048 A1 | 6/2009 | Satake et al. |
| 2009/0167171 A1 | 7/2009 | Jung et al. |
| 2009/0201443 A1 | 8/2009 | Sasaki et al. |
| 2009/0219247 A1 | 9/2009 | Watanabe et al. |
| 2009/0251431 A1 | 10/2009 | Lee et al. |
| 2009/0256471 A1 | 10/2009 | Kim et al. |
| 2009/0270142 A1 | 10/2009 | Liang |
| 2010/0006845 A1 | 1/2010 | Seo et al. |
| 2010/0026952 A1 | 2/2010 | Miura et al. |
| 2010/0045705 A1 | 2/2010 | Vertegaal et al. |
| 2010/0052521 A1 | 3/2010 | Kim et al. |
| 2010/0073593 A1 | 3/2010 | Sasaki et al. |
| 2010/0097344 A1 | 4/2010 | Verweg |
| 2010/0110041 A1 | 5/2010 | Jang et al. |
| 2010/0123670 A1 | 5/2010 | Philipp |
| 2010/0134426 A1 | 6/2010 | Lee et al. |
| 2010/0164888 A1 | 7/2010 | Okumura et al. |
| 2010/0214247 A1 | 8/2010 | Tang et al. |
| 2010/0225612 A1 | 9/2010 | Ishizaki et al. |
| 2010/0231549 A1 | 9/2010 | Chien et al. |
| 2010/0238367 A1 | 9/2010 | Montgomery et al. |
| 2010/0238612 A1 | 9/2010 | Hsiao et al. |
| 2010/0265187 A1 | 10/2010 | Chang et al. |
| 2011/0007011 A1 | 1/2011 | Mozdzyn |
| 2011/0032209 A1 | 2/2011 | Kim |
| 2011/0086680 A1 | 4/2011 | Kim et al. |
| 2011/0102360 A1 | 5/2011 | Chen et al. |
| 2012/0127087 A1 | 5/2012 | Ma |
| 2012/0218219 A1 | 8/2012 | Rappoport et al. |
| 2012/0242588 A1 | 9/2012 | Myers et al. |
| 2013/0081756 A1 | 4/2013 | Franklin et al. |
| 2013/0082984 A1 | 4/2013 | Drzaic et al. |
| 2013/0140965 A1 | 6/2013 | Franklin |

FOREIGN PATENT DOCUMENTS

| | | |
|---|---|---|
| EP | 0929027 A2 | 7/1999 |
| EP | 1635313 | 3/2006 |
| EP | 1827057 | 8/2007 |
| EP | 1970886 | 9/2008 |
| EP | 2192750 | 6/2010 |
| EP | 2202624 | 6/2010 |
| JP | Hei 6-66969 | 3/1994 |
| JP | 2000163031 | 6/2000 |
| JP | 2000-293117 | 10/2000 |
| JP | 2001-154592 | 6/2001 |
| JP | 2001189978 | 7/2001 |
| JP | 2002232992 | 8/2002 |
| JP | 2002342033 | 11/2002 |
| JP | 2003125315 | 4/2003 |
| JP | 2003179988 | 6/2003 |
| JP | 2003-211087 | 7/2003 |
| JP | 2003-208548 | 10/2003 |
| JP | 2003280546 | 10/2003 |
| JP | 2004173264 | 6/2004 |
| JP | 2005-091873 | 4/2005 |
| JP | 2005110216 | 4/2005 |
| JP | 2007-272107 | 10/2007 |
| JP | 2008283350 | 11/2008 |
| JP | 2008-216543 | 9/2009 |
| JP | 2010-008480 | 1/2010 |
| JP | 2010-191246 | 9/2010 |
| JP | 2010-198615 | 9/2010 |
| JP | 2010-231186 | 10/2010 |
| JP | 2011-023558 | 2/2011 |
| JP | 2001061194 | 3/2011 |
| KR | 10-2010-0061121 | 6/2010 |
| WO | 02095342 | 11/2002 |
| WO | 2004036297 | 4/2004 |
| WO | 20047082114 | 7/2007 |
| WO | 2010/009655 | 1/2010 |
| WO | 2011/003253 | 1/2011 |

OTHER PUBLICATIONS

Bhattacharya et al., "Organic LED Pixel Array on a Dome" The IEEE, vol. 93, No. 7, Jul. 2005.
Stedmon et al., "Sound And Tangible Interfaces for Novel product design" Satin, Nov. 2007.

(56) References Cited

OTHER PUBLICATIONS

Wagner et al., "Flexible thin-film transistor backplanes" Department of Electrical Engineering, and Princeton Institute for the Science and Technology of Materials.

TOUCH SENSITIVE DISPLAYS

This application is a division of U.S. patent application Ser. No. 13/186,238, filed Jul. 19, 2011, which is hereby incorporated by reference herein in its entirety. This application claims the benefit of and claims priority to U.S. patent publication Ser. No. 13/186,238, filed Jul. 19, 2011.

BACKGROUND

This relates to displays, and, more particularly, to displays that include touch sensors.

Displays are widely used in electronic devices to display images. Displays such as organic light emitting diode (OLED) displays use organic emissive materials to produce light.

In many electronic devices, it is desirable to incorporate touch screen functionality into a display. Touch screens can be used to provide a device with a touch interface. A touch interface may allow users to interact with a device through on-screen touch commands such as finger taps and swipes.

A typical touch screen includes a touch sensor panel with an array of touch sensor electrodes. Touch sensor processing circuits can measure capacitance changes on the touch sensor electrodes to determine the position at which a user's finger is contacting the touch array.

The inclusion of a touch panel in a display may be desirable to provide the display with touch sensing capabilities, but may add undesirable bulk to the display. The touch panel substrate may also reduce light transmission and thereby interfere with the ability of the display to display images for a user.

It would therefore be desirable to provide improved touch sensitive displays.

SUMMARY

Displays such as organic light-emitting diode displays may be provided with touch sensing capabilities. The display may have an array of display pixels. The display pixels may be formed from organic light-emitting diodes. Control lines may be coupled to the display pixels. To display images on the display, control signals may be provided to the organic light-emitting diodes using the control lines.

The organic light-emitting diodes may be encapsulated with a thin-film encapsulation layer. A touch sensor may be formed from capacitive touch sensor electrodes. The electrodes may be formed on the thin-film encapsulation layer, on one or more sides of a polarizer, or on a touch panel substrate in a single-sided or double-sided touch sensor panel. The display pixel control lines may also serve as touch electrodes.

A display may have an active region surrounded by an inactive peripheral region. When mounting the display within an electronic device housing, the inactive peripheral regions and part of the active region may be bent downwards away from the front of the display so that the display becomes borderless. The bent edge portions may form sidewalls for the electronic device housing. Virtual buttons may be formed on the sidewalls.

Further features of the invention, its nature and various advantages will be more apparent from the accompanying drawings and the following detailed description of the preferred embodiments.

DETAILED DESCRIPTION

Figure 1:
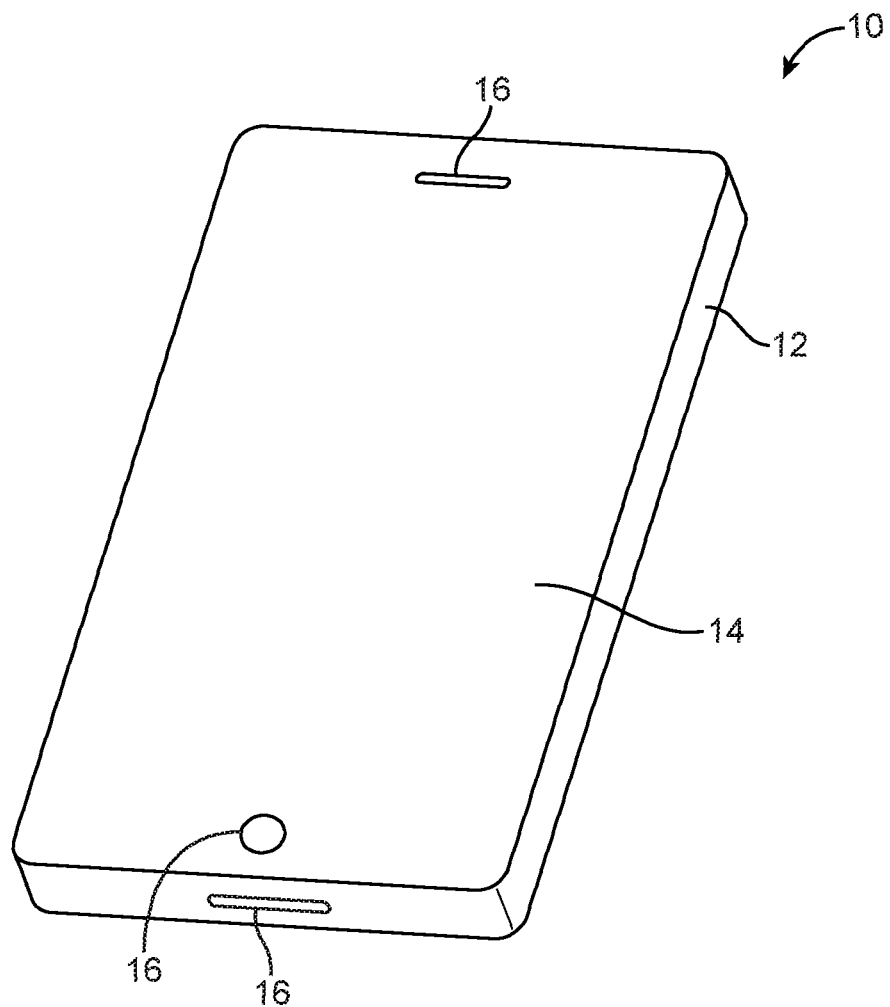
FIG. 1 is a perspective view of an illustrative electronic device of the type that may be provided with a touch screen display in accordance with an embodiment of the present invention.

An electronic device of the type that may be provided with a display is shown in FIG. 1. As shown in FIG. 1, electronic device 10 may have a housing 12. Buttons, input-output ports, and other components 16 may be provided in housing 12. Display 14 may be mounted in housing 12 on the front surface of device 10 (as shown in FIG. 1) or may be mounted in other suitable locations within housing 12. If desired, housing 12 may have multiple sections such as first and second sections that are connected with a hinge (i.e., housing 12 may be associated with a portable computer or other hinged device).

Electronic device 10 may be a computer monitor for a desktop computer, a kiosk, a table-based computer, a portable computer such as a laptop or tablet computer, a media player, a television, a gaming device, a cellular telephone or other handheld computing device, or may be a somewhat smaller portable device. Examples of smaller portable electronic devices include wrist-watch devices and pendant devices. These are merely examples. In general, display 14 may be incorporated into any suitable electronic device.

Figure 2:
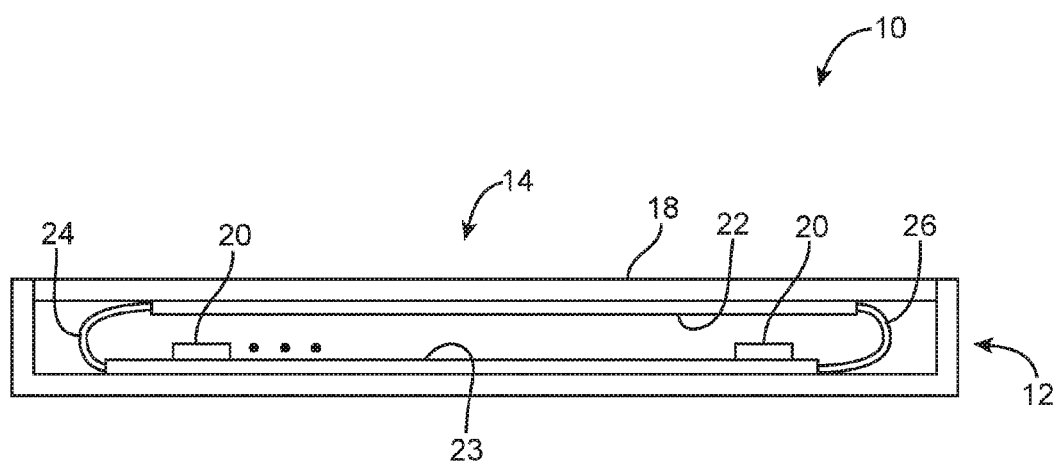
FIG. 2 is a cross-sectional side view of an illustrative electronic device with a touch screen display in accordance with an embodiment of the present invention.

FIG. 2 is a cross-sectional side view of device 10. As shown in FIG. 2, a cover layer such as cover glass layer 18 may be used to provide display 14 with a robust outer surface. Cover layer 18 may be formed from glass, plastic, other suitable transparent materials, or combinations of these materials.

Touch sensor and display components 22 and cover layer 18 may be housed in housing structures 12. Structures 12 may include plastic chassis members, metal chassis structures, housing wall structures, or other suitable mounting or support structures.

Touch sensor and display components 22 may include display pixel structures such as light-emitting diodes and display circuitry for controlling the light-emitting diodes. Touch sensor and display components 22 may also include a touch sensor. The touch sensor may, for example, be formed from capacitive touch sensor electrodes with which capacitance measurements may be made. When the surface of display 14 is touched by a user's finger or another external object, the measured capacitance will change. Measured capacitance data may then be converted into touch event data for use by device 10. Measureable capacitance changes can be detected both when the user touches the display and when the user brings a finger or other external object into close proximity to the display surface without directly touching the surface of the display.

If desired, touch sensor functionality may be incorporated into display 14 using other touch technologies (e.g., resistive touch technology, acoustic touch technology, light-based touch sensor configurations, pressure sensors, etc.). The use of capacitive touch sensor arrangements in display 14 is described herein as an example.

As shown in FIG. 2, device 10 may contain substrates such as printed circuit board 23. Components 20 may be mounted on printed circuit board 23. Components 20 may include integrated circuits, connectors, switches, discrete components, and other circuitry and structures for supporting the operation of device 10. Communications paths such as paths 24 and 26 may be used to convey signals between components 20 on printed circuit board 23 and touch and display components 22 in display 14. Paths such as paths 24 and 26 may be formed from flexible printed circuits ("flex circuits"), cables, traces on a rigid printed circuit board, etc. Flex circuits may include a pattern of conductive traces on a flexible sheet of polymer such as polyimide or other flexible dielectric substrate. Flex circuit paths or other paths 24 and 26 may be used to couple display circuitry (e.g., a display driver integrated circuit in components 22) to touch sensor and display components 22 in display 14 and may be used to couple a touch sensor controller (e.g., a touch sensor integrated circuit in components 22) to touch sensor and display components 22.

Figure 3:
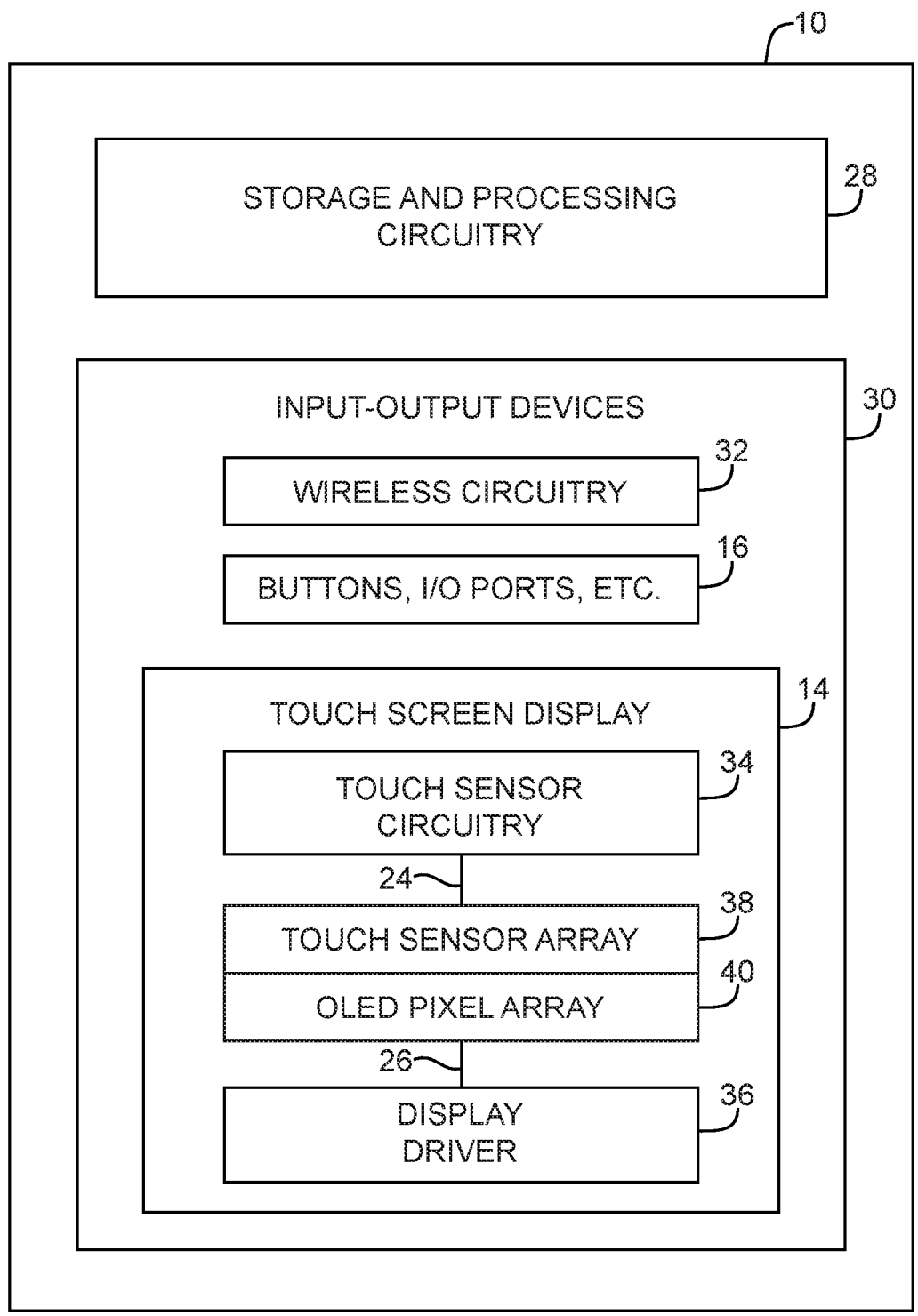
FIG. 3 is a diagram of an illustrative electronic device with a touch screen display in accordance with an embodiment of the present invention.

As shown in FIG. 3, device 10 may include storage and processing circuitry 28 and input-output devices 30. Storage and processing circuitry 28 may include processor circuits such as one or more microprocessors, baseband processor integrated circuits, microcontrollers, applications-specific integrated circuits, or other processing circuitry. Storage and processing circuitry 28 may include volatile and non-volatile memory, hard drive storage, solid state drives (SSDs), removable storage media, or other storage circuitry. Storage and processing circuitry may handle tasks associated with displaying images for a user, processing touch commands, displaying on-screen options and gathering user touch responses, displaying status indicators, taking appropriate actions in response to user input and sensor input, etc.

Input-output devices 30 may include wireless circuitry 32 such as wireless local area network transceiver circuitry, satellite navigation receiver circuitry, cellular telephone network transceiver circuitry, etc.

Input-output devices 30 may also include buttons, input-output connector ports, speakers, microphones, sensors, and other components 16.

Touch screen display 14 may include touch sensor array 38. Array 38 may include a pattern of capacitive touch sensor electrodes. Touch sensor circuitry 34 may be coupled to touch sensor array 38 by path 24. Touch sensor circuitry 34 may include one or more integrated circuits or other circuitry for making capacitance measurements and converting capacitance measurements into touch event location information (e.g., X-Y information that locates a touch event at a particular vertical and horizontal location on the surface of display 14). Touch sensor circuitry 34 may, if desired, detect and process multi-touch events in which a user touches the surface of display 14 at multiple locations simultaneously. The electrodes of touch sensor array 38 may be organized to form a self-capacitance sensor in which the presence of the external object alters the capacitance between sensor electrodes and ground or a mutual-capacitance sensor in which the presence of the external object alters the capacitive coupling between a pair of electrodes (e.g., a drive line and a sense line).

Images may be displayed for a user of device 10 using pixel array 40. Pixel array 40 may, as an example, be formed using organic light-emitting diode (OLED) technology. Other types of display technology may also be used if desired. Arrangements in which pixel array 40 contains an array of organic light-emitting diode pixels are sometime described herein as an example.

Display driver 36 may receive data to be displayed on device 10 from storage and processing circuitry 28. The data may include images and/or text to be displayed. Display driver 36 may convey the data that is to be displayed to OLED pixel array 40 over path 26. Display driver circuitry 36 may be implemented using one or more integrated circuits.

Figure 4:
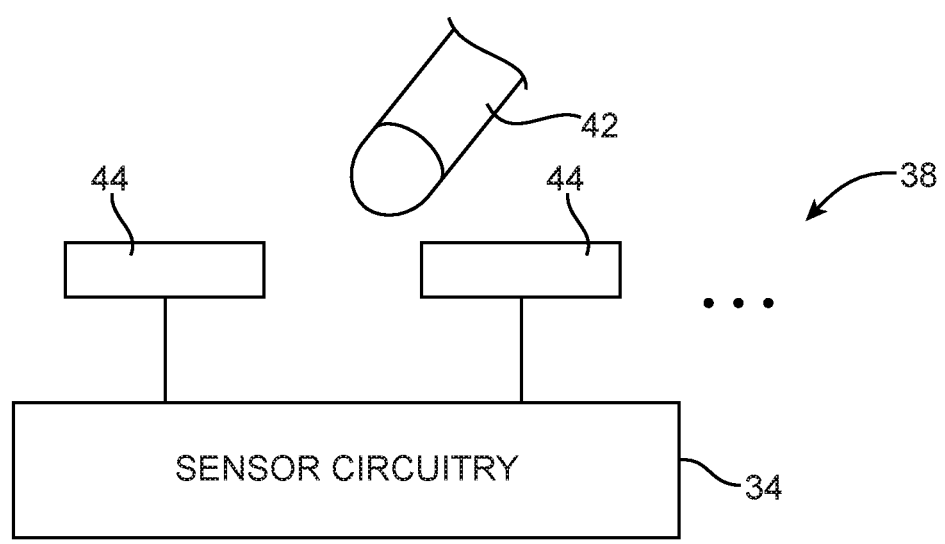
FIG. 4 is a diagram showing how capacitive touch sensing capabilities for a display may be provided using an array of electrodes that are coupled to capacitive sensing circuitry in accordance with an embodiment of the present invention.

A portion of an illustrative touch sensor array is shown in FIG. 4. As shown in FIG. 4, touch sensor array 38 may contain electrodes 44. When a user's finger or other external object 42 is placed in the vicinity of electrodes (e.g., in the vicinity of a pair of electrodes), sensor circuitry 34 can detect capacitance changes that are converted into touch event data for device 10. Electrodes 44 may be implemented using rectangular pads, narrow or thick lines of conductive material, diamond-shaped pads, meandering traces, or other suitable patterned conductor shapes. In some arrangements, electrodes 44 may be formed from metals such as copper, aluminum, gold, etc. In other arrangements, electrodes 44 may be formed from conductive material such as indium tin oxide (e.g., a transparent semiconductor or other transparent conductive material).

To ensure that capacitance measurements can be accurately made using the touch sensor electrodes, it may be desirable to place electrodes 44 in the vicinity of the outermost surface of display 14 (i.e., directly under cover glass 18). In this type of arrangement, sensor array 38 will be interposed between display array 40 and cover glass 18. To avoid disrupting the user's ability to view display array 40, it may be desirable to form electrodes 44 in this type of arrangement from a transparent conductive material such as indium tin oxide (ITO).

Figure 5:
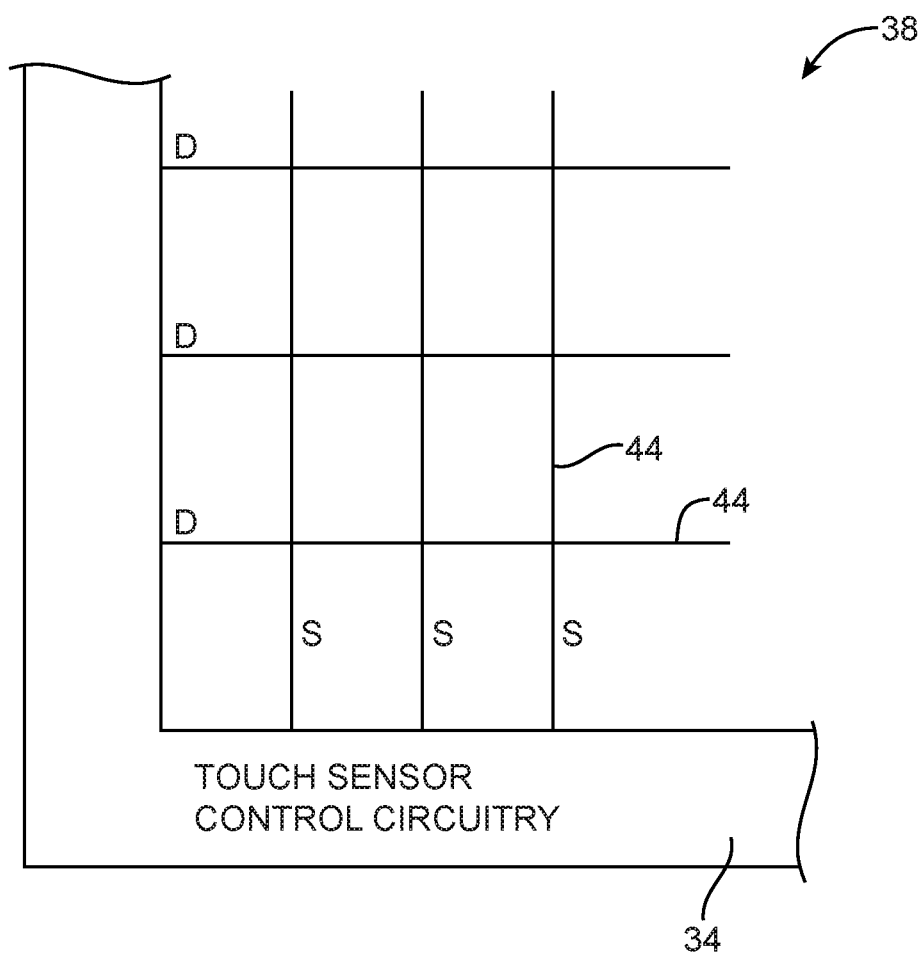
FIG. 5 is a diagram of an illustrative capacitive touch sensor array coupled to touch sensor control circuitry that detects touch events by measuring capacitance changes in the capacitive touch sensor array in accordance with an embodiment of the present invention.
Figure 6:
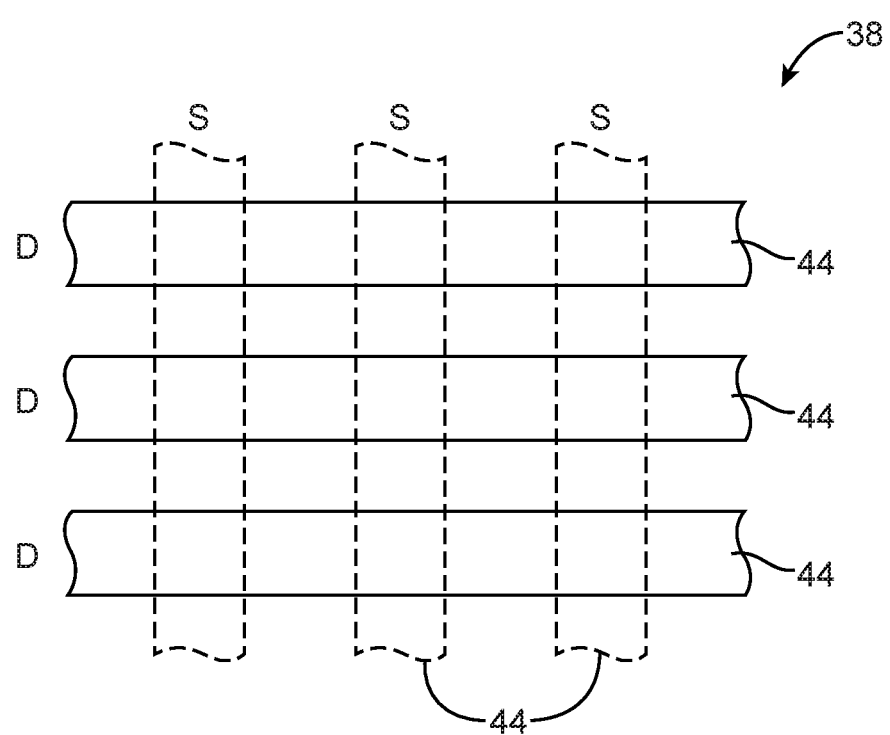
FIG. 6 is a top view of illustrative capacitive electrode structures showing an illustrative capacitive electrode pattern that may be used in a touch sensor array in accordance with an embodiment of the present invention.

Any suitable pattern may be used for the sensor electrodes in touch sensor array 38. As shown in FIG. 5, for example, touch sensor electrodes 44 may be implemented using horizontal lines (e.g., drive lines D) and vertical lines (e.g., sense lines S). The horizontal and vertical lines may intersect one another to form a grid. When a user's finger or other object is placed in the vicinity of a particular location on the grid, sensor control circuitry 34 can be used to detect a corresponding capacitance change between a drive lines D and a sense line S. In arrangements of the type shown in FIG. 5, lines D and S may be formed from relatively narrow strips of metal or other conductive material. If desired, the drive and sense electrodes may be formed from larger regions of patterned conductive material (e.g., wide strips of ITO). As shown in FIG. 6, for example, drive electrodes D and sense electrodes S may be formed from rectangular conductive regions that are organized to form intersecting columns and rows.

In sensor arrays 38, electrodes 44 may be formed on a single side of substrate (sometimes referred to as a single-sided ITO or SITO arrangement) or may be formed on opposing sides of a substrate (sometimes referred to as a double-sided ITO or DITO arrangement). As an example, the drive lines D in sensor arrays 38 of FIGS. 5 and 6 may be formed on an upper substrate surface and the sense lines S in sensor arrays 38 of FIGS. 5 and 6 may be formed on an opposing lower substrate surface.

Figure 7:
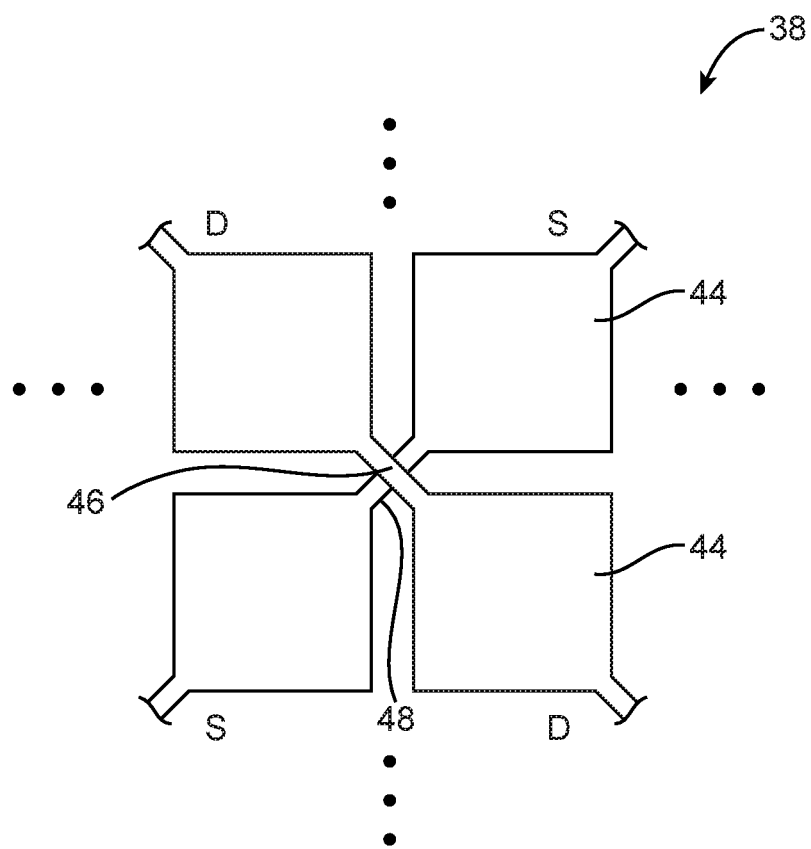
FIG. 7 is top view of an illustrative capacitive electrode pattern formed form linked square electrode pads in accordance with an embodiment of the present invention.
Figure 8:
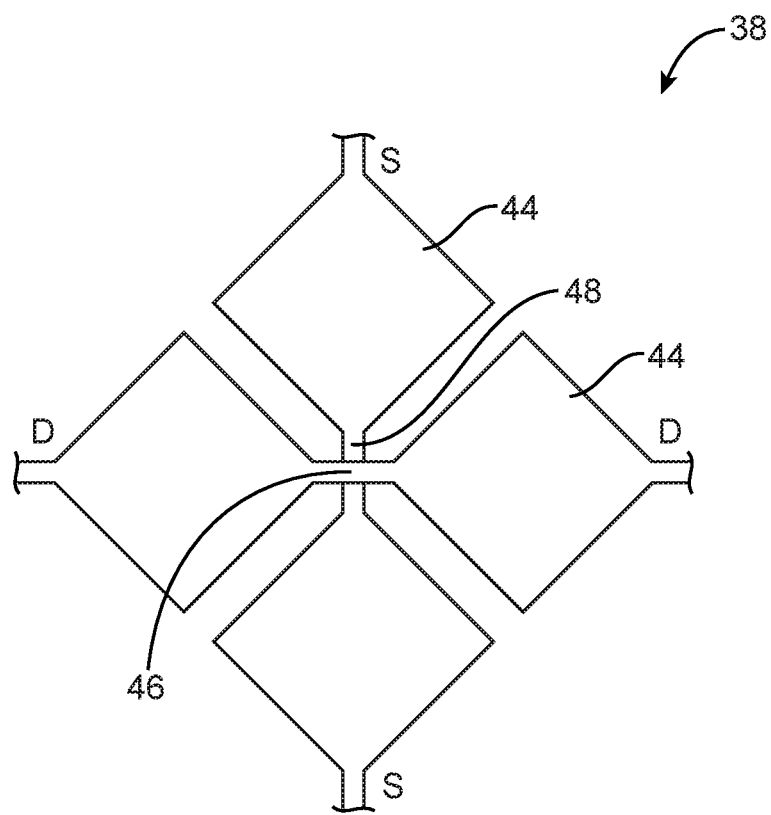
FIG. 8 is top view of an illustrative capacitive electrode pattern formed form linked diamond-shaped electrode pads in accordance with an embodiment of the present invention.

Another illustrative pattern that may be used for electrodes 44 in sensor array 28 is shown in FIG. 7. The drive lines D and sense lines S in this type of configuration may be formed from a series of linked polygonal pads. Conductive paths such as path 46 may be used to form a series of diagonally aligned electrode pads in a drive line D. Conductive paths such as path 48 may be used to form a series of intersecting diagonally aligned electrodes pads in sense line S. An intervening layer of dielectric may be placed between paths 46 and 48 where they overlap to avoid shorting the drive and sense lines together. By using a layer of intervening dielectric at the cross-over points in array 38, the drive and sense lines of sensor array 38 of FIG. 7 may, if desired, be formed on a single side of a substrate (i.e., using a SITO arrangement). DITO arrangements may be used to form a sensor array with a pattern of the type shown in FIG. 7 (as an example). In the FIG. 8 example, diamond-shaped electrode pads 44 have been connected to form vertical drive lines D and horizontal sense lines S for sensor array 38. As with the FIG. 7 configuration, electrodes 44 of FIG. 8 may be formed on a single side of a substrate or may, if desired, be formed on two opposing sides of a substrate. Electrodes of other shapes may be used if desired. The use of square and diamond electrode pad shapes in the examples of FIGS. 7 and 8 is merely illustrative.

Figure 9:
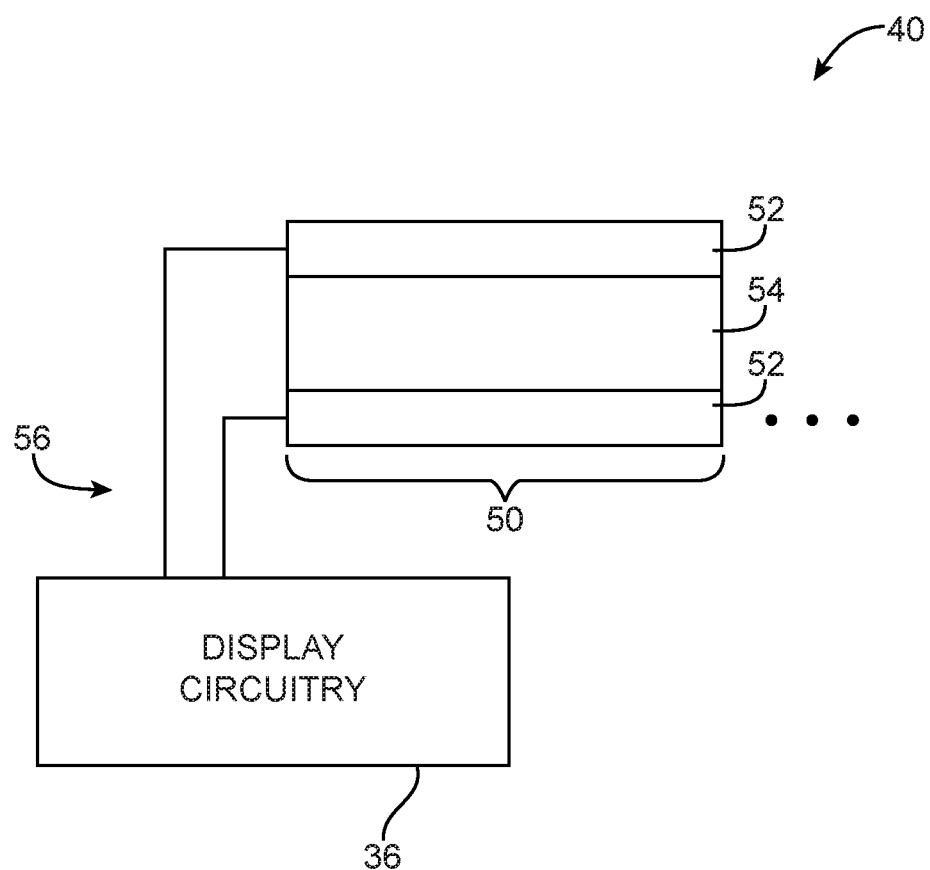
FIG. 9 is a diagram of display circuitry coupled to an array of light-emitting diodes in accordance with an embodiment of the present invention.

As shown in FIG. 9, pixel array 40 may include display pixels that include organic light-emitting diodes such as organic light-emitting diode 50 (e.g., an array of rows and columns of display pixels). Display control circuitry 36 may issue control commands on paths such as path 56 that apply a signal to each organic light-emitting diode 50. An organic layer such as organic material 54 in each diode 50 may emit light when a signal is applied using electrodes 52.

Figure 10:
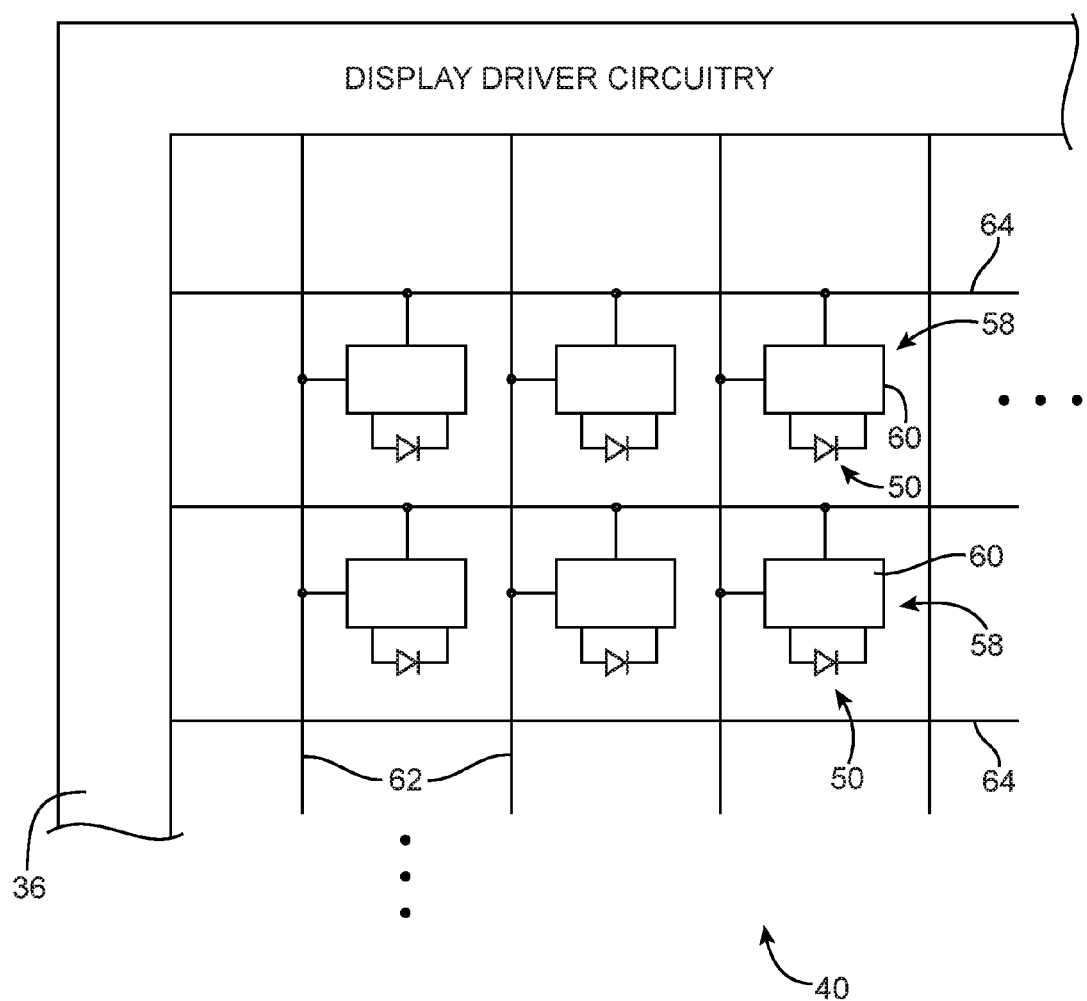
FIG. 10 is diagram of an illustrative display pixel array having rows and columns of organic light-emitting diodes and having associated display driver circuitry for supplying control singles to the organic light-emitting diodes over a grid of control lines in accordance with an embodiment of the present invention.

Pixel array 40 may form part of an active matrix display or a passive display. In a passive display arrangement, pixels containing respective organic light-emitting diodes may be controlled by signals applied through a grid of intersecting horizontal and vertical control lines. An illustrative active display arrangement is shown in FIG. 10. As shown in FIG. 10, each pixel 58 in active display pixel array 40 may contain an associated set of electrical components 60 (e.g., transistors, etc.) for controlling the application of current to its associated light-emitting diode 50. The pixel control circuit formed from electrical components 60 may be controlled by control signals applied to the array of pixels 58 by a display driver circuit (e.g., display circuitry 36) using horizontal control lines 64 and vertical control lines 62.

Figure 11:
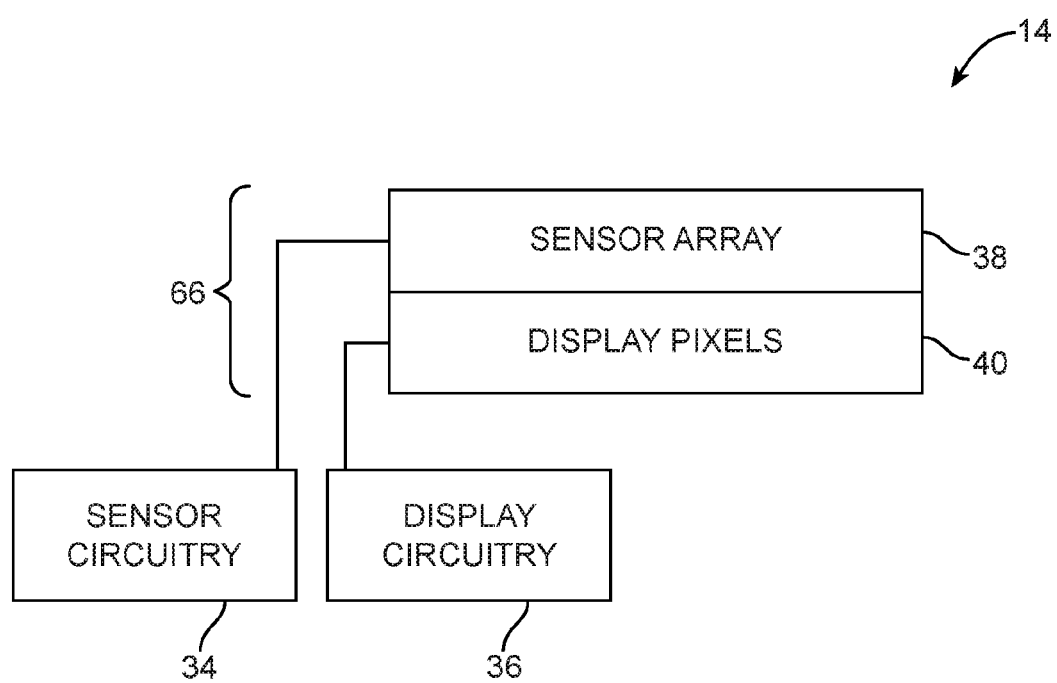
FIG. 11 is a diagram of an illustrative display having a capacitive sensor array and an array of display pixels in accordance with an embodiment of the present invention.

As shown in FIG. 11, touch screen display 14 may have planar touch sensor and display structures 66 that include a pattern of capacitive electrodes that form sensor array 38 and a two-dimensional array of display pixels 40. Sensor circuitry 34 may gather and process capacitance signals from the electrodes in sensor array 38. Display driver circuitry 36 may be used to supply signals to display pixels 40 that direct display pixels 40 to display images on display 14. The structures that make up sensor array 38 may be combined with the structures that make up display pixels 40 by forming electrodes 44 on one or more of the layers used in forming display pixels 40.

With one suitable arrangement, electrodes 44 may be formed from conductive material that that lies under the black masking material in display pixels 40. Because the electrode material is formed under the black masking material, reflections from the electrode material may be blocked from view by a user. The conductive material under the black masking material may be patterned to form conductive lines. To ensure that each electrode pad or other electrode structure has sufficient surface area, the conductive lines may be patterned to form mesh (grid) electrodes.

Figure 12:
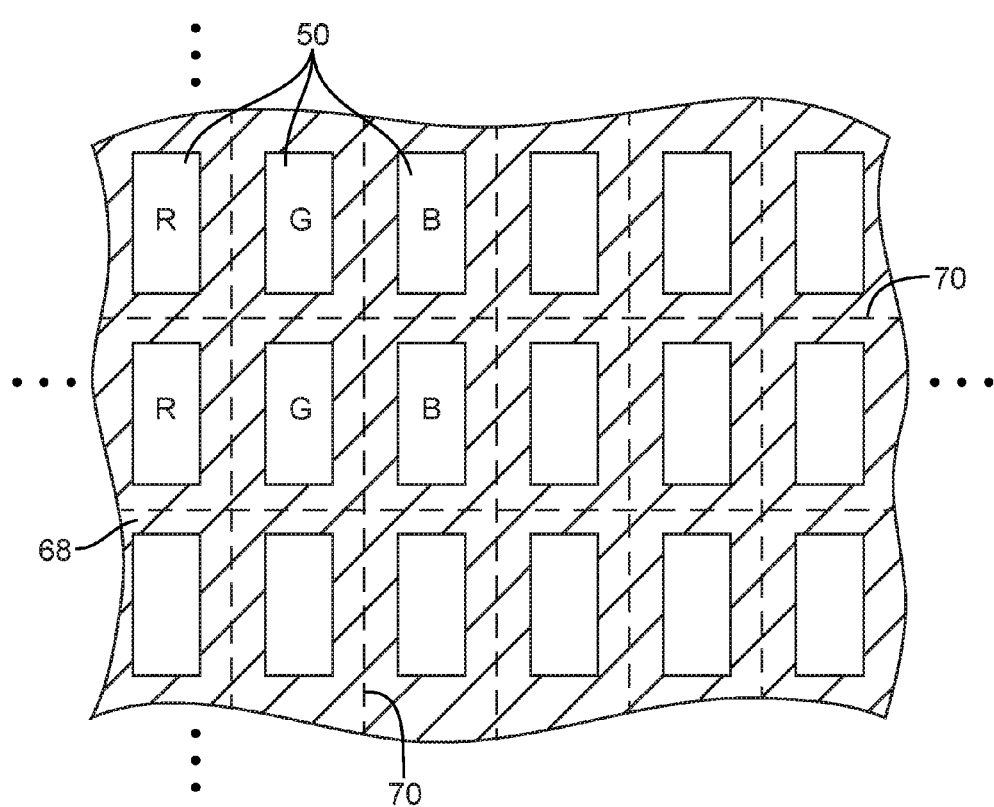
FIG. 12 is a top view of an illustrative display showing how a black masking material may be used to cover conductive lines that convey control signals to display pixels and that gather touch sensor capacitance measurements in accordance with an embodiment of the present invention.

FIG. 12 is a top view of a portion of display pixel structures 40. As shown in FIG. 12, the structures may contain numerous individual pixels (e.g., red pixels R, green pixels G, and blue pixels B), organized in a repeating pattern. Black mask region 68 is interspersed between pixels (i.e., in the space that separates the active pixel regions formed by organic light-emitting diodes 50). Black mask region 68 may be formed from carbon black, black chrome, or other opaque substances. When display 14 is viewed by a user from the exterior of device 10, black mask 68 blocks internal device components such as metal signal lines in display 14 from view. The metal signal lines are shown as lines 70 in FIG. 12.

In conventional displays, black mask material may be used to cover display control lines. In a device such as device 10 of FIG. 1, lines 70 may include touch sensor lines and display control lines. The display control lines may be used to route control signals to the array of light-emitting diodes (i.e., to the control circuitry of display pixels 40 and associated organic light-emitting diodes 50). The touch sensor lines within lines 70 may, for example, be used in forming a grid-shaped pattern of conductor that forms individual electrodes 44. For example, a diamond-shaped electrode pad may be formed using a grid of lines 70 under black mask region 68. Multiple diamond-shaped pads of this type may be interconnected to form diagonal drive and signal lines for touch sensor array 38. The touch sensor lines (in this example) may be shielded from view by the user using black mask material 68, so it is not necessary to form the touch sensor lines from a transparent conductor. The touch sensor lines may therefore be formed from a metal such as copper, aluminum, gold, other metals (including alloys), etc. Transparent conductive materials such as indium tin oxide may also be used in forming the touch sensor conductors in lines 70.

Figure 13:
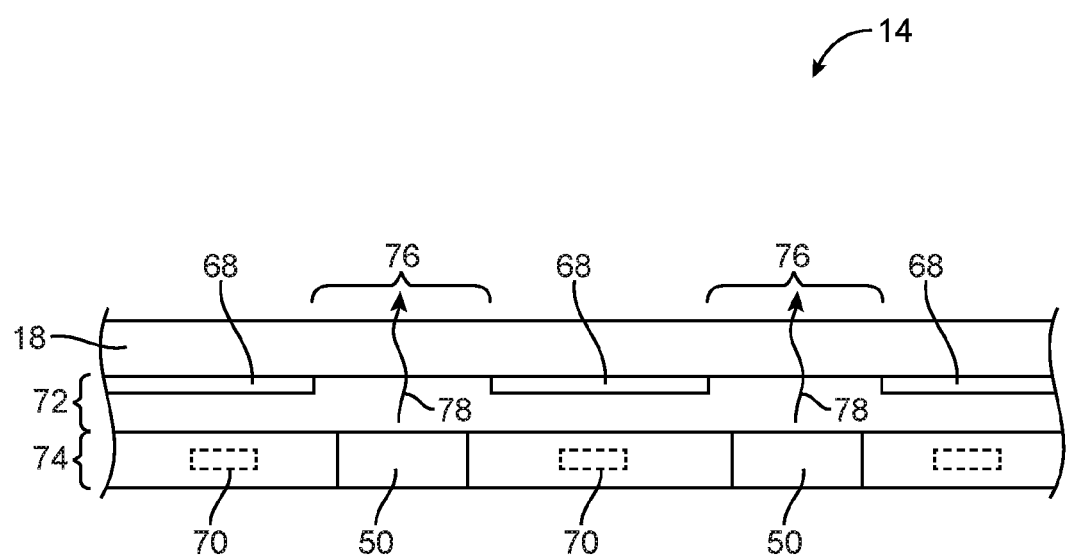
FIG. 13 is a cross-sectional side view of an illustrative display having a patterned black masking layer that overlaps conductive lines including lines for control signals and lines for gathering touch sensor capacitance measurements in accordance with an embodiment of the present invention.

A cross-sectional side view of display 14 showing how black masking material 68 may, if desired, be formed on the lower (inner) surface of cover glass layer 18 is shown in FIG. 13. Glass 18 may be mounted on display structures 74 using adhesive (e.g., pressure sensitive adhesive, optically clear adhesive, etc.) in region 72 or other suitable mounting techniques (e.g., techniques that form an air gap in region 72). As shown in FIG. 13, black masking material 68 may have clear openings 76. Clear openings 76 (i.e., rectangular openings or regions of other suitable shapes in the black masking layer) may be aligned with pixels 40, so that light 78 from pixels 40 can pass through cover glass layer 18. Black masking regions 68 overlap conductors 70 in display structures 74.

Display structures 74 may include one or more layers of material (e.g., a substrate layer, a polarizer layer, an organic emissive layer for organic light-emitting diodes, a thin film encapsulation layer, a layer of optically clear adhesive, pressure sensitive adhesive, etc.). Conductors 70 may be formed on top of one or more of these layers, underneath one or more of these layers, on top and bottom sides of one or more of these layers, or may be embedded within one or more of these layers. By aligning conductors 70 so that they are hidden from view by black masking layer 68, the need to form conductors 70 from a transparent conductor can be eliminated. Pad-shaped touch sensor electrodes (e.g., squares, diamonds, meandering shapes, etc.) and/or column-shaped touch sensor electrodes can be formed from a grid of lines 70.

Figure 14:
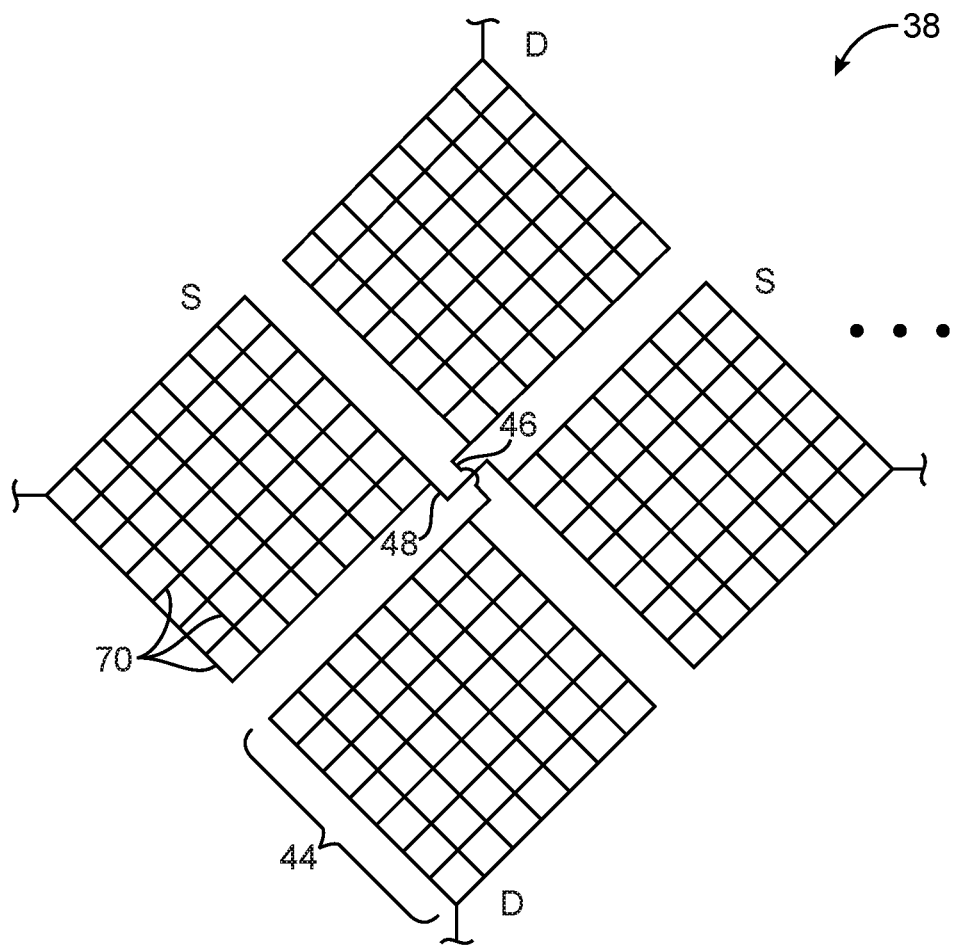
FIG. 14 is a top view of illustrative patterned capacitive touch sensor electrodes formed from linked diamond-shaped pads each of which is formed from a grid of conductive lines in accordance with an embodiment of the present invention.
Figure 15:
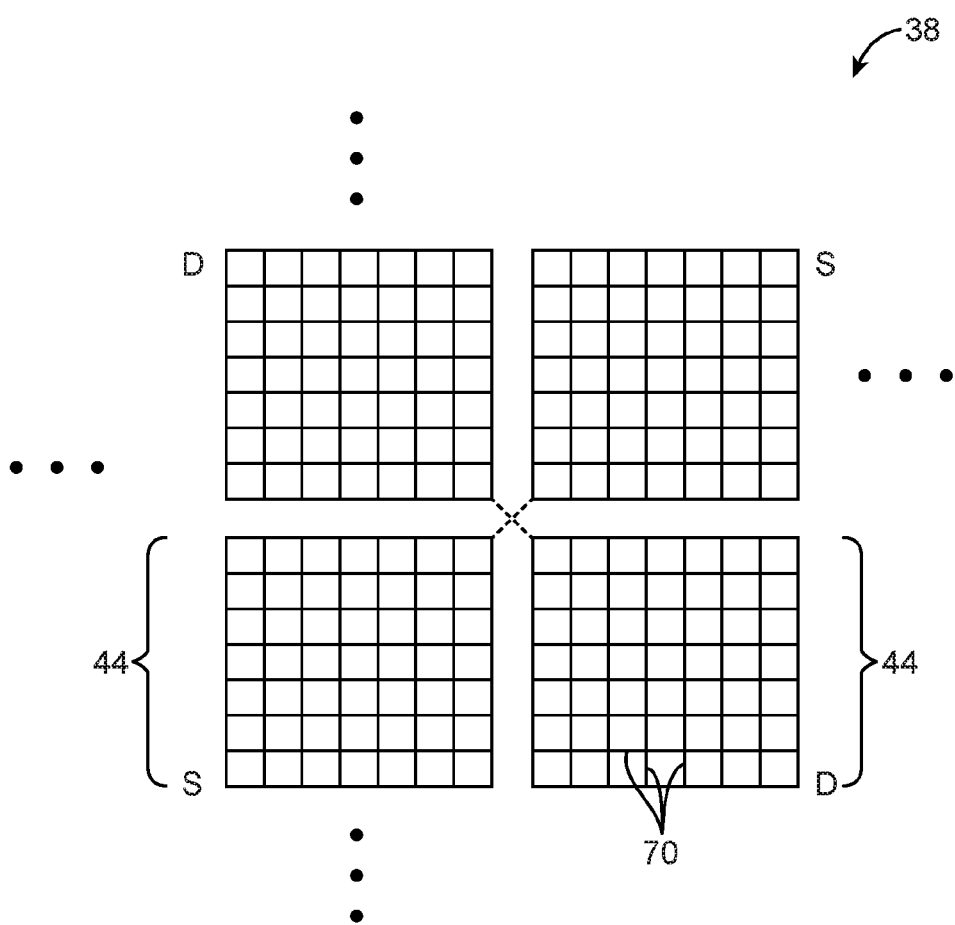
FIG. 15 is a top view of illustrative patterned capacitive touch sensor electrodes formed from linked rectangular pads each of which is formed from a grid of conductive lines in accordance with an embodiment of the present invention.

FIG. 14 is a top view of a portion of an illustrative sensor array showing how sensor electrodes 44 for forming drive lines D and sense lines S may be formed from a series of horizontally and vertically linked mesh (grid) structures (i.e., mesh structures in which lines 70 are formed around the periphery of light-emitting diodes 50 in the display pixels under black masking material 68, as described in connection with FIG. 13. Overpass and underpass conductive structures such as overpass structure 46 and underpass structure 48 may be used to interconnect each diamond-shaped mesh electrode to the next, thereby forming vertical drive electrode structures (columns) D and horizontal sense electrode structures (rows) S. In the FIG. 15, example, grids of conductive lines 70 have been configured to form rectangular electrode pads for drive lines D and sense lines S in array 38.

Figure 16:
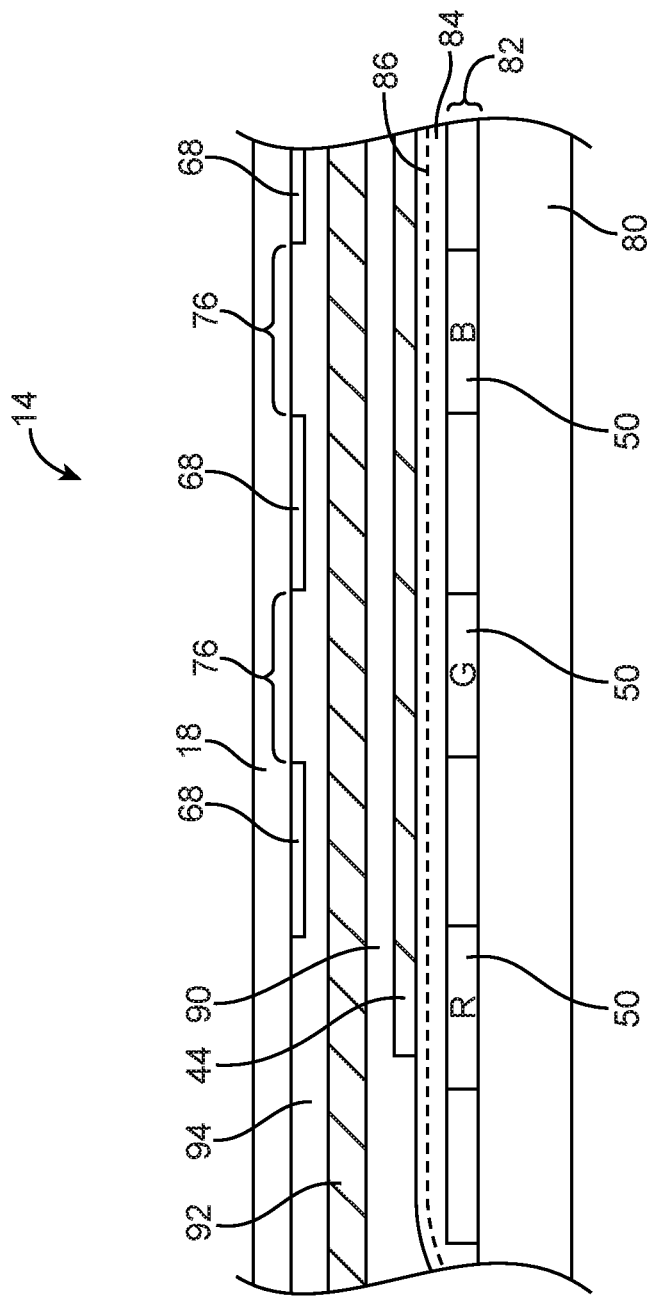
FIG. 16 is a cross-sectional side view of an illustrative display having capacitive touch sensor electrodes formed on a thin-film encapsulation layer that encapsulates an array of organic light-emitting diodes in accordance with an embodiment of the present invention.

A cross-sectional side view of an illustrative configuration that may be used for display 14 is shown in FIG. 16. In the illustrative configuration of FIG. 16, a single-sided electrode arrangement (e.g., a SITO arrangement) has been used to form touch sensor electrodes 44 on top of thin-film encapsulation layer 84. Electrodes 44 may be formed from metal (e.g., using a mesh arrangement of the type described in connection with FIGS. 12, 13, 14, and 15 in which the metal lines are formed so that they are covered by overlapping black masking material 68) or may be formed from patterned transparent conductive material such as indium tin oxide or other conductive material. Electrodes 44 may be patterned to form linked diamond-shaped pads, linked square pads, columns, rows, or other suitable electrode shapes (e.g., shapes that form drive lines D and sense lines S for touch sensor array 38).

Display 14 may be formed on a substrate such as substrate 80. Substrate 80 may be, for example, a layer of polymer such as polyimide or other suitable substrate material. Organic light-emitting diode layer 82 may contain a layer of organic material that forms the light-emitting structure for light-emitting diodes 50. To prevent moisture and other environmental contaminants from degrading organic light-emitting diodes 50, light-emitting diodes 50 may be covered with a thin-film encapsulation (TFE) layer such as thin-film encapsulation layer 84.

As illustrated by dashed line 86, thin-film encapsulation layer 84 may contain multiple layers of material (e.g., two or more layers, three or more layers, four or more layers, etc.). The layers of material in thin-film encapsulation layer 84 may include inorganic material such as aluminum oxide (e.g., for forming a moisture barrier) and, if desired, organic material such as polymers (e.g., epoxy) that may serve as stress relief layers. Other types of thin-film encapsulation layers (e.g., layers formed from a single type of material, layers formed from alternating patterns of organic and inorganic layers, layers including different types of material, etc.) may be used in forming thin-film encapsulation layer 84 if desired.

Figure 18:
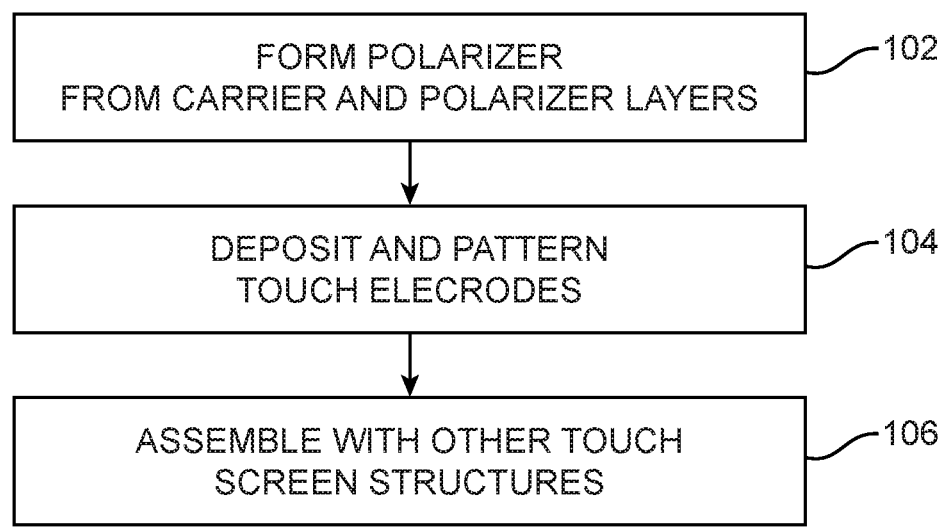
FIG. 18 is a flow chart of illustrative steps involved in forming capacitive touch sensor electrodes on a polarizer in accordance with an embodiment of the present invention.

After depositing and patterning conductive material to form touch sensor electrodes 44 on the upper surface of thin-film encapsulation layer 84, polarizer 92 may be attached to electrode layer 44, exposed portions of thin-film encapsulation layer 84, and underlying structures such as substrate 80 using adhesive 90 (e.g., pressure sensitive adhesive, optically clear adhesive, or other suitable adhesives). Polarizer 92 may be formed from one or more polarizer layers (films). As shown in FIG. 18, these layers may include, for example, triacetyl cellulose (TAC) layers 96, polyvinyl alcohol (PVA) layer 98, and plastic carrier (substrate) 100.

Figure 17:
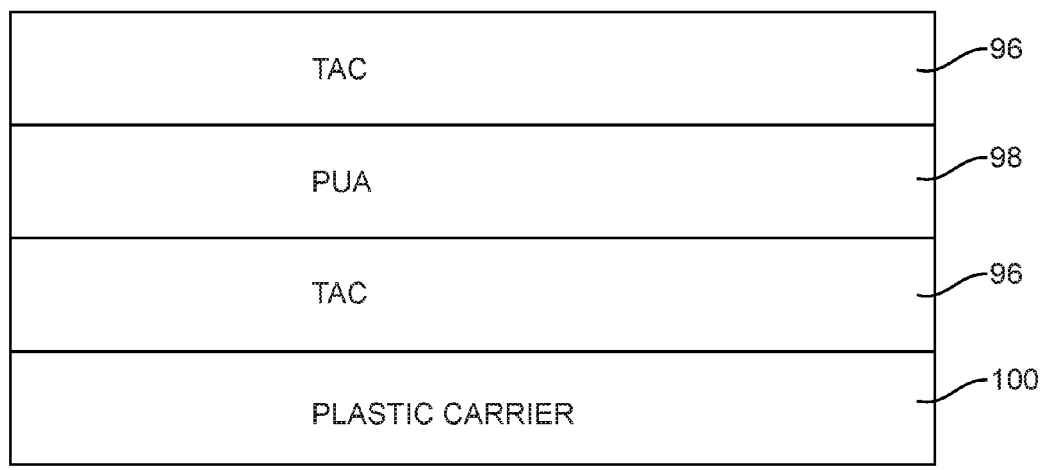
FIG. 17 is a cross-sectional side view of an illustrative polarizer in accordance with an embodiment of the present invention.

As shown in FIG. 17, cover glass layer 18 may have a layer of patterned black masking material 68 on its interior surface. Black masking material 68 may have clear openings 76. During assembly, cover glass layer 18 may be attached to display 14 using adhesive 94 (e.g., pressure sensitive adhesive, optically clear adhesive, or other suitable adhesives), so that clear regions 76 are aligned with and overlap light-emitting diodes 50.

If desired, touch sensor electrodes 44 may be incorporated into display 14 by forming electrode structures on one or more polarizer layers such as one or more of polarizer layers 96, 98, and 100 of FIG. 17. The electrode structures may be formed on the polarizer after the layers of the polarizer have been combined to form the polarizer or may be formed on one or more of the polarizer layers before the polarizer layers have been assembled to form the polarizer.

Figure 19:
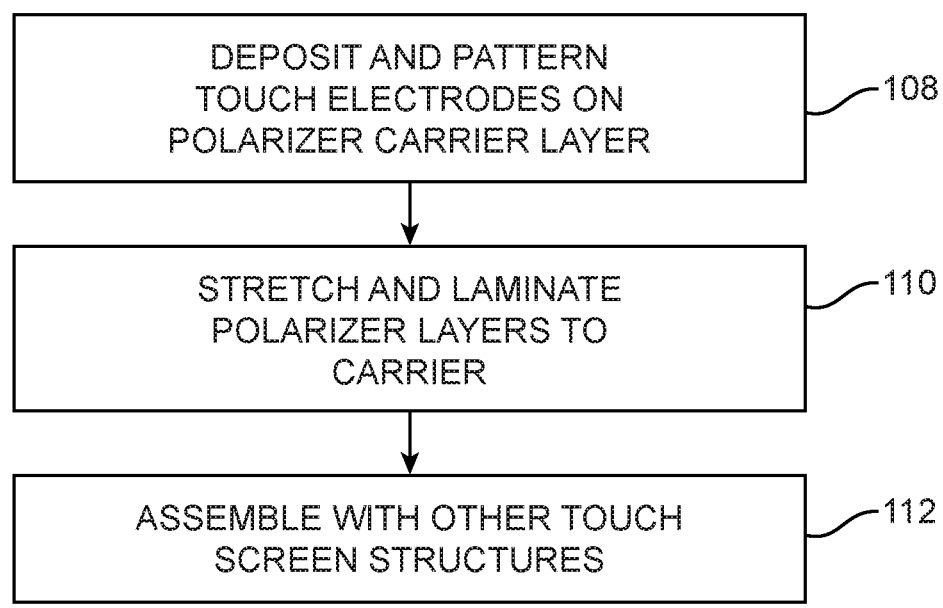
FIG. 19 is a flow chart of illustrative steps involved in forming capacitive touch sensor electrodes on a polarizer layer that is combined with additional polarizer layers to form a polarizer in accordance with an embodiment of the present invention.

FIGS. 18 and 19 are flow charts of illustrative steps involved in forming a touch sensitive display that includes a polarizer with touch sensor electrodes. The flow chart of FIG. 18 shows steps involved in forming electrodes on a polarizer. The flow chart of FIG. 19 shows steps involved in forming a polarizer from layers that include deposited and patterned touch sensor electrodes.

In the example of FIG. 18, a polarizer for a display may be formed from polarizer carrier layer 100, TAC layers 96, and PVA layer 98 or other suitable polarizer layers (step 102). The layers of the polarizer may, for example, be laminated to one another. The TAC layers may be stretched prior to lamination. The PVA layer may be doped with iodine to provide polarization.

At step 104, following assembly of the polarizer layers to form the polarizer for the display, electrodes 44 may be deposited and patterned on the polarizer (e.g., using physical vapor deposition and photolithographic patterning). The electrodes may be deposited on the upper surface of the polarizer, the lower surface of the polarizer, or on both the upper and lower surfaces of the polarizer.

At step 106, the polarizer on which patterned touch sensor electrodes 44 have been formed may be assembled with other display layers (e.g., the organic light-emitting diode layer, thin-film encapsulation layer, substrate layer, adhesive layers, cover glass layer, etc.) to form display 14.

As shown in the example of FIG. 19, touch sensor electrodes may be formed on part of the polarizer before assembling the rest of the polarizer and installing the polarizer in the display. At step 108, for example, touch sensor electrodes 44 may be deposited and patterned on a polarizer layer such as carrier layer 100 (FIG. 17). The touch sensor electrodes may be deposited using physical vapor deposition and may be patterned using photolithography (as an example).

At step 110, following formation of the electrodes on the carrier layer, the remaining polarizer layers (e.g., TAC layers 96 and PVA layer 98) may be stretched and laminated to the carrier and its associated touch sensor electrodes. The operations of step 110 may be used to produce a completed polarizer that incorporates touch sensor electrodes.

At step 112, the polarizer with the integral touch sensor electrodes may be assembled with other display structures (e.g., the organic light-emitting diode layer, thin-film encapsulation layer, substrate layer, adhesive layers, cover glass layer, etc.) to form display 14.

Figure 20:
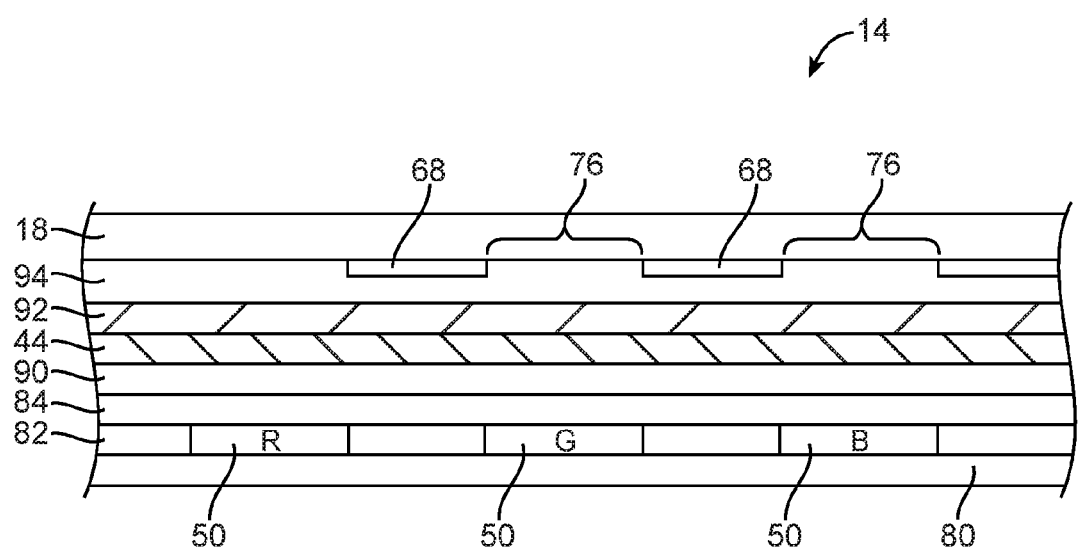
FIG. 20 is a cross-sectional side view of an illustrative display in which touch sensor electrodes have been formed on the lower surface of a polarizer in accordance with an embodiment of the present invention.

Touch sensor electrodes may be formed on one surface or multiple surfaces of a polarizer. FIG. 20 is a cross-sectional side view of an illustrative display in which touch sensor electrodes 44 have been formed on a lower surface of polarizer layer 92. As shown in FIG. 20, organic light-emitting diode layer 82 may include an array of light-emitting diodes 50 formed on substrate 80. Substrate 80 may be, for example, a dielectric substrate such as a sheet of polyimide or other polymer (as an example). Thin-film encapsulation layer 84 (e.g., one or more moisture barrier and/or stress relief layers such as layers of aluminum oxide, epoxy, etc.) may be used to encapsulate organic light-emitting diode layer 82.

Touch sensor electrodes 44 may be formed on the underside of polarizer 92 by forming polarizer 92 before depositing and patterning electrodes 44 as described in connection with FIG. 18 or by depositing and patterning electrodes 44 on the polarizer carrier layer prior to assembly of the carrier layer with other polarizer layers as described in connection with FIG. 19. Polarizer 92 (with the patterned touch sensor electrodes on its lower surface) may be attached to thin-film encapsulant layer 84 of FIG. 20 using adhesive 90 (e.g., pressure sensitive adhesive, optically clear adhesive, or other suitable adhesive).

Adhesive 94 (e.g., pressure sensitive adhesive, optically clear adhesive, or other suitable adhesive) may be used to attach cover layer 18 to the upper surface of polarizer 92 of FIG. 20. Black masking material 68 may be formed on the lower surface of cover layer 18 (or on other suitable layers in display 14). Clear regions 76 (i.e., openings in black masking layer 68) may be aligned with light-emitting diodes 50 in organic light-emitting diode layer 82.

Figure 21:
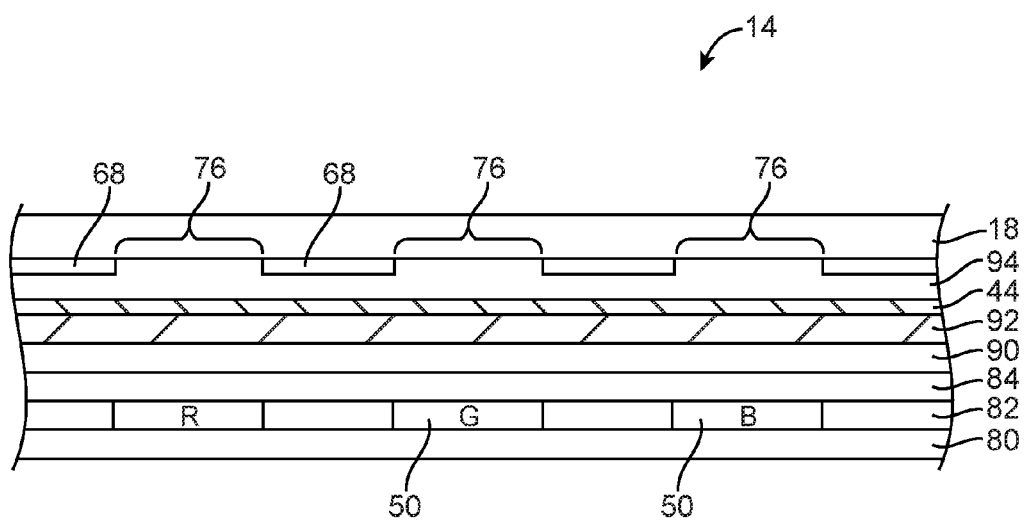
FIG. 21 is a cross-sectional side view of an illustrative display in which touch sensor electrodes have been formed on the upper surface of a polarizer in accordance with an embodiment of the present invention.

In the illustrative configuration of FIG. 21, touch sensor electrodes 44 have been formed on the upper surface of polarizer layer 92 rather than the lower surface of polarizer 92. Electrodes 44 of display 14 of FIG. 21 may be formed by forming polarizer 92 before depositing and patterning electrodes 44 as described in connection with FIG. 18 or by depositing and patterning electrodes 44 on the polarizer carrier layer prior to assembly of the carrier layer with other polarizer layers as described in connection with FIG. 19.

Figure 22:
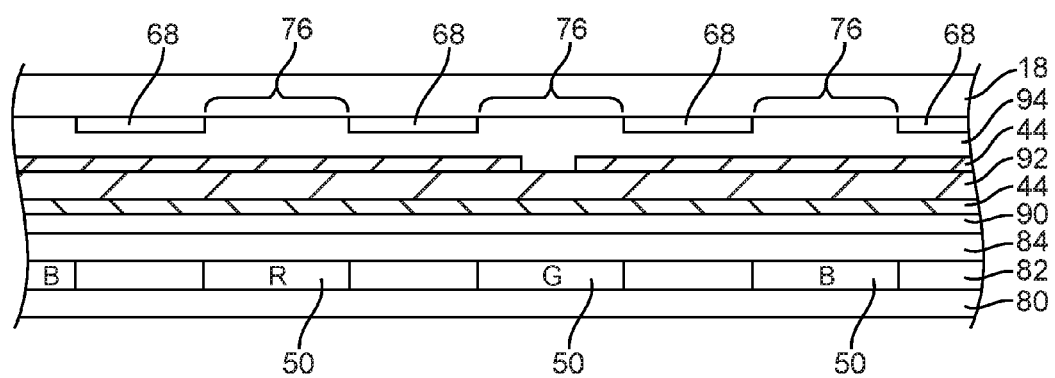
FIG. 22 is a cross-sectional side view of an illustrative display in which touch sensor electrodes have been formed on both the upper and lower surfaces of a polarizer in accordance with an embodiment of the present invention.

If desired, touch sensor electrodes 44 may be formed on both the upper and lower surfaces of polarizer 92 (e.g., using a DITO arrangement). A display with this type of configuration is shown in FIG. 22. As shown in FIG. 22, electrodes 44 (e.g., indium tin oxide electrodes or electrodes formed from other transparent conductive materials) may be deposited and patterned on both the upper and lower surfaces of polarizer 92 (e.g., using fabrication techniques of the type described in connection with FIG. 18).

Figure 23:
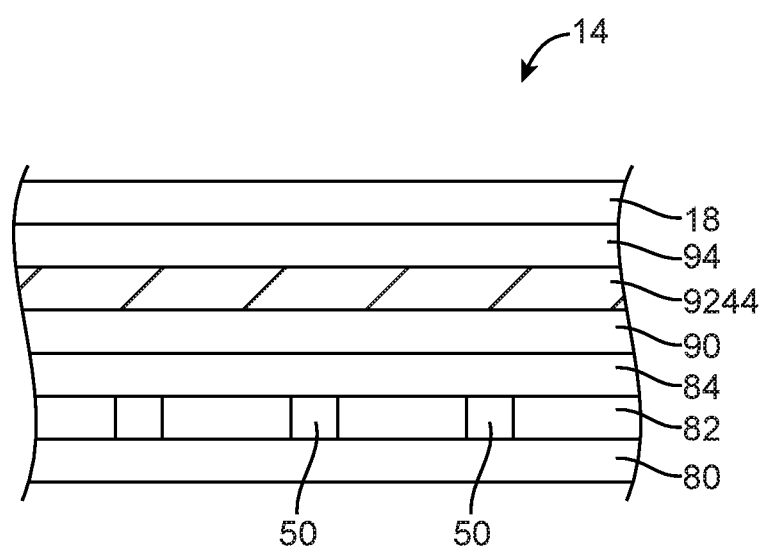
FIG. 23 is a cross-sectional side view of an illustrative display in which a touch sensor panel formed from electrodes on a touch panel substrate has been attached to a polarizer in accordance with an embodiment of the present invention.

If desired, a touch sensor panel may be formed using a SITO or DITO arrangement and may be attached to the upper or lower surface of polarizer 92. FIG. 23 is a cross-sectional side view of an illustrative arrangement of this type that may be used in forming display 14. As shown in FIG. 23, organic light-emitting diode layer 82 and its light-emitting diodes 50 may be formed on substrate 80 and covered with thin-film encapsulation layer 84. Layer 9244 may be formed from a polarizer to which a touch sensor panel has been attached using adhesive. Layer 9244 may be attached to thin-film encapsulant layer 84 using adhesive 90 (e.g., pressure sensitive adhesive, optically clear adhesive, or other suitable adhesives or attachment mechanisms). Cover glass layer 18 may be attached to the upper surface of layer 9244 using adhesive 94 (e.g., pressure sensitive adhesive, optically clear adhesive, or other suitable adhesives).

Figure 24:
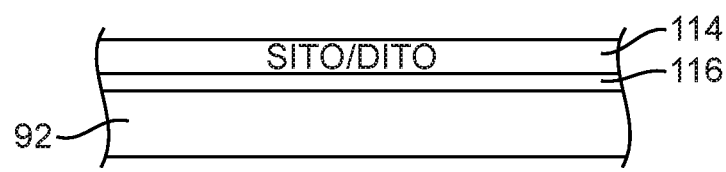
FIG. 24 is a cross-sectional side view of an illustrative single-sided or double-sided touch panel mounted to the upper surface of a polarizer in accordance with an embodiment of the present invention.

FIG. 24 is a cross-sectional diagram showing how layer 9244 may be formed from a polarizer such as polarizer 92. A SITO or DITO touch sensor panel such as touch sensor layer 114 may be attached to the upper surface of polarizer 92 using adhesive 116 (e.g., pressure sensitive adhesive, optically clear adhesive, etc.).

Figure 25:
FIG. 25 is a cross-sectional side view of an illustrative single-sided or double-sided touch panel mounted to the lower surface of a polarizer in accordance with an embodiment of the present invention.

FIG. 25 is a cross-sectional diagram showing how layer 9244 may be formed from a polarizer such as polarizer 92 having a lower surface to which a SITO or DITO touch sensor panel such as touch sensor layer 114 has been attached using adhesive 116 (e.g., pressure sensitive adhesive, optically clear adhesive, etc.).

Figure 26:
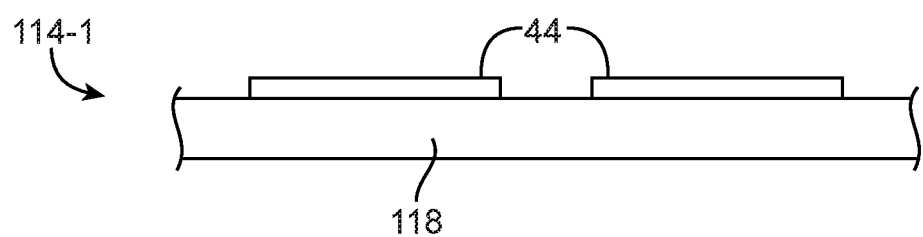
FIG. 26 is a cross-sectional side view of a touch panel that has capacitive touch sensor electrodes formed on a single surface of a touch panel substrate in accordance with an embodiment of the present invention.

FIG. 26 is a cross-sectional diagram of an illustrative SITO touch sensor panel of the type that may be used as panel 114 in layers 9244 of FIGS. 24 and 25. As shown in FIG. 26, SITO touch sensor panel 114-1 has a single sided electrode configuration in which a single surface of planar dielectric touch sensor substrate 118 is provided with touch sensor electrodes 44. Substrate 118 may be a dielectric layer such as a sheet of polymer or other substrate material. Electrodes 44 may be formed from indium tin oxide or other transparent conductive materials. Patterns that may be used for single-sided electrodes such as electrodes 44 of FIG. 26 include electrodes formed from interconnected diamond-shaped pads and interconnected rectangular electrode pads (as examples). Electrodes 44 may be formed on the upper surface or the lower surface of touch sensor panel substrate 118.

Figure 27:
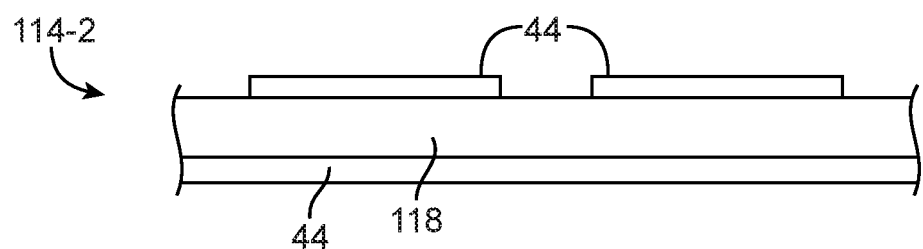
FIG. 27 is a cross-sectional side view of a touch panel that has capacitive touch sensor electrodes formed on opposing upper and lower surfaces of a touch panel substrate in accordance with an embodiment of the present invention.

FIG. 27 is a cross-sectional diagram of an illustrative DITO touch sensor panel of the type that may be used as panel 114 in layers 9244 of FIGS. 24 and 25. As shown in FIG. 27, DITO touch sensor panel 114-2 has a two-sided electrode configuration in which both the upper and lower opposing surfaces of touch sensor substrate 118 are provided with touch sensor electrodes 44. Substrate 118 may be a dielectric layer such as a sheet of polymer or other substrate material. Electrodes 44 may be formed from indium tin oxide or other transparent conductive materials. Patterns that may be used for single-sided electrodes such as electrodes 44 of FIG. 26 include row/column patterns of the type described in connection with FIG. 6 (as an example).

Figure 28:
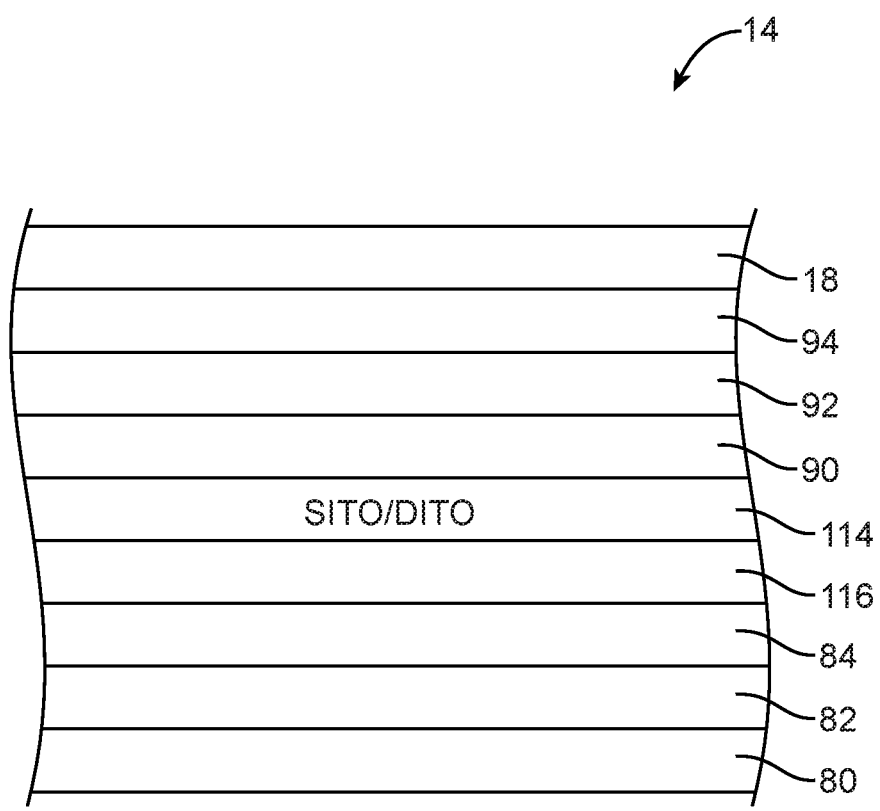
FIG. 28 is a cross-sectional side view of a touch sensor in which a touch panel has been formed under a layer of polarizer and adhesive in accordance with an embodiment of the present invention.

If desired, the touch panel (e.g., a single-sided panel such as touch sensor panel 114-1 of FIG. 26 or a double-sided touch panel such as touch sensor panel 114-2 of FIG. 27) may be placed under polarizer 92 and adhesive 90, as shown in FIG. 28. This type of arrangement may improve optical quality by helping to hide the ITO of electrodes 44 from view by a user.

Figure 29:
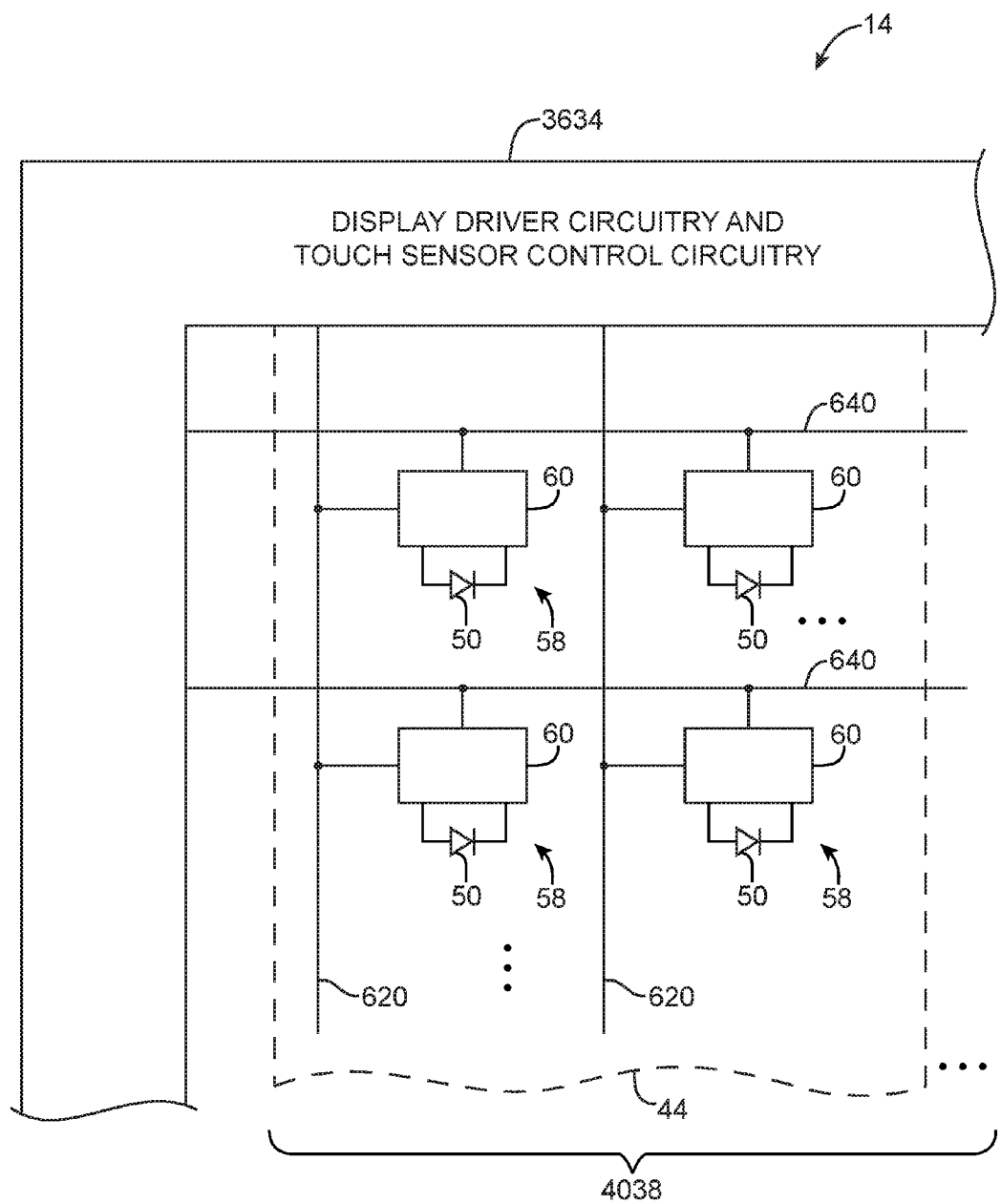
FIG. 29 is a diagram of a display having control lines that are coupled to display pixels for supplying signals to light-emitting diodes in the display pixels and having a touch sensor that is formed at least partly from the control lines and partly from transparent electrode structures that intersect the control lines in accordance with an embodiment of the present invention.

FIG. 29 is a circuit diagram showing how display 14 may be formed from an array that contains conductive lines that are used for both touch sensing and display pixel control functions. As shown in FIG. 29, display 14 may have display driver and touch sensor control circuitry 3634 that is coupled to array 4038. Array 4038 may include horizontal lines such as lines 640 and vertical lines such as lines 620. Array 4038 may contain rows and columns of display pixels 58, each of which has an associated light-emitting diode 50 (e.g., an organic light-emitting diode) and an associated control circuits 60 (e.g., transistors, etc.).

Circuitry 3634 may contain display driver circuitry that produces control signals on lines 620 and 640 that cause a desired image to be displayed on display 14 by pixels 58. Control lines 640 may sometimes be referred to as emission lines. In addition to display driver circuitry that allows array 4038 to function as a display, circuitry 3634 may contain touch sensor control circuitry that gathers touch data from array 4038.

With one suitable arrangement, the touch sensor control circuitry transmits capacitive touch sensor array drive signals onto some of the same lines that are used to convey display control signals. For example, touch sensor control circuitry in circuitry 3634 may generate capacitive touch sensor drive signals that are supplied to horizontal lines 640 in array 4038 (i.e., lines 640 may serve as touch sensor drive lines in addition to serving as emission lines for display pixels 58). Other conductive lines (e.g., vertically extending columns of indium tin oxide electrodes such as electrode 44 of FIG. 29) may serve as touch sensor sense lines. A time division multiplexing scheme or other multiplexing scheme may be used to ensure that the drive signals that are driven onto lines 640 during capacitive touch sensor capacitance measurements operations do not interfere with the control signals that are supplied to display pixels 58.

Figure 30:
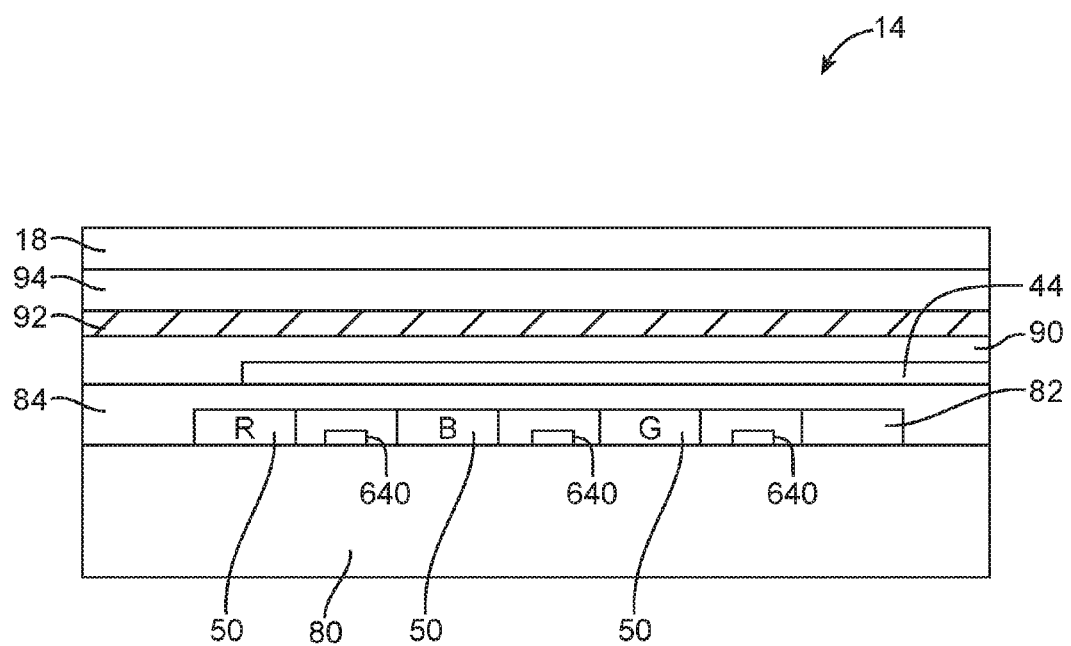
FIG. 30 is a cross-sectional side view of a touch panel having control lines that supply control signals to light-emitting diodes and having a touch sensor that is formed at least partly from the control lines and partly from transparent electrode structures formed on a thin-film encapsulation layer in accordance with an embodiment of the present invention.
Figure 31:
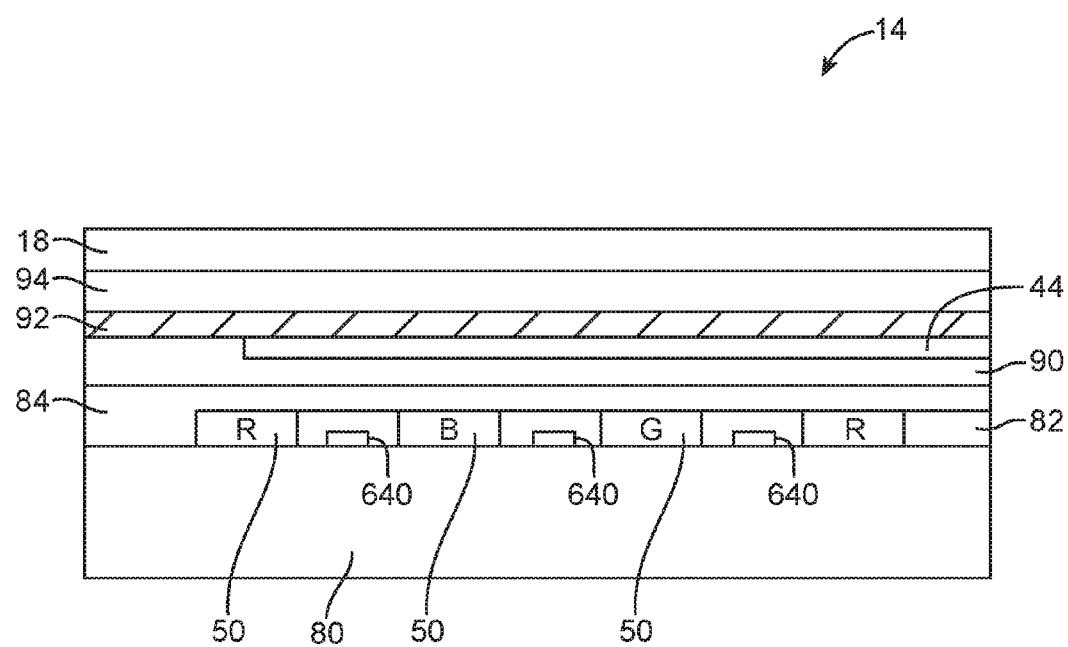
FIG. 31 is a cross-sectional side view of a touch panel having control lines that supply control signals to light-emitting diodes and having a touch sensor that is formed at least partly from the control lines and partly from transparent electrode structures formed on a lower surface of a polarizer in accordance with an embodiment of the present invention.
Figure 32:
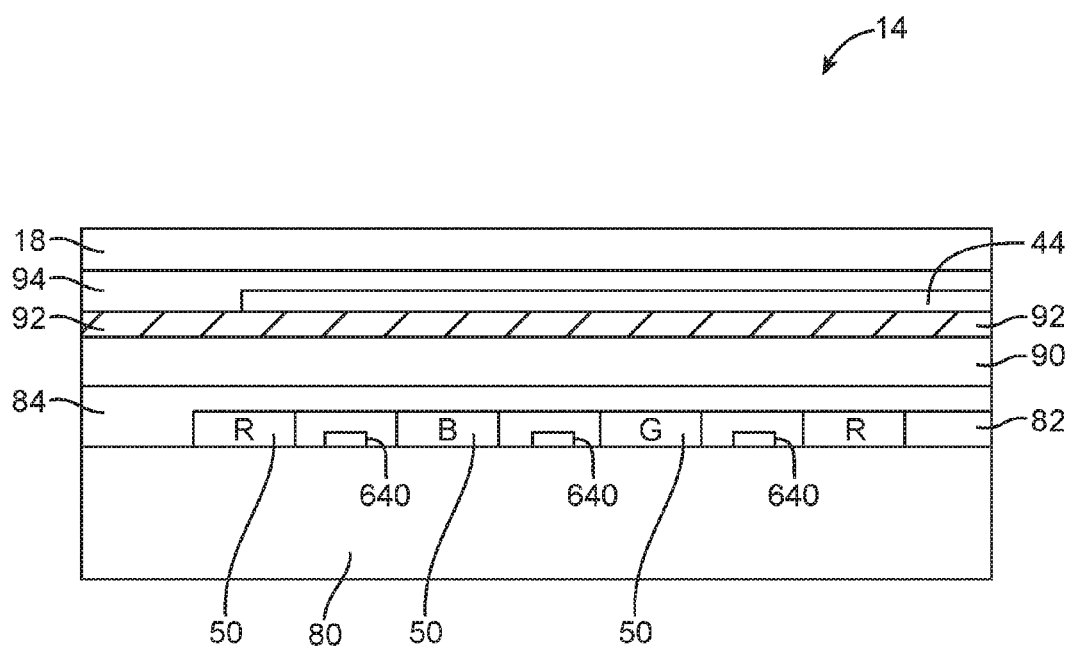
FIG. 32 is a cross-sectional side view of a touch panel having control lines that supply control signals to light-emitting diodes and having a touch sensor that is formed at least partly from the control lines and partly from transparent electrode structures formed on an upper surface of a polarizer in accordance with an embodiment of the present invention.

Electrodes 44 of FIG. 29 may be formed on any suitable layer or layers in display 44 (e.g., a substrate layer, a thin-film encapsulation layer, a polarizer layer, etc.). FIG. 30 is a cross-sectional side view of an illustrative configuration that may be used for display 14 in which capacitive touch sensor electrodes such as electrodes 44 of FIG. 29 have been formed on top of thin-film encapsulation layer 84. FIG. 31 is a cross-sectional side view of an illustrative configuration for display 14 in which capacitive touch sensor electrodes 44 such as electrodes 44 of FIG. 29 have been formed on the lower surface of polarizer 92. In the FIG. 32 example, capacitive touch sensor electrodes 44 such as electrodes 44 of FIG. 29 have been formed on the upper surface of polarizer 92. In arrangements of the type shown in FIGS. 30, 31, and 32, emission lines 640 may be organized into groups of parallel lines that serve as drive lines D for the touch sensor in array 4038 and electrodes 44 may be patterned to form intersecting columns (or other suitable shapes) that serve as sense lines for the touch sensor in array 4038.

Figure 33:
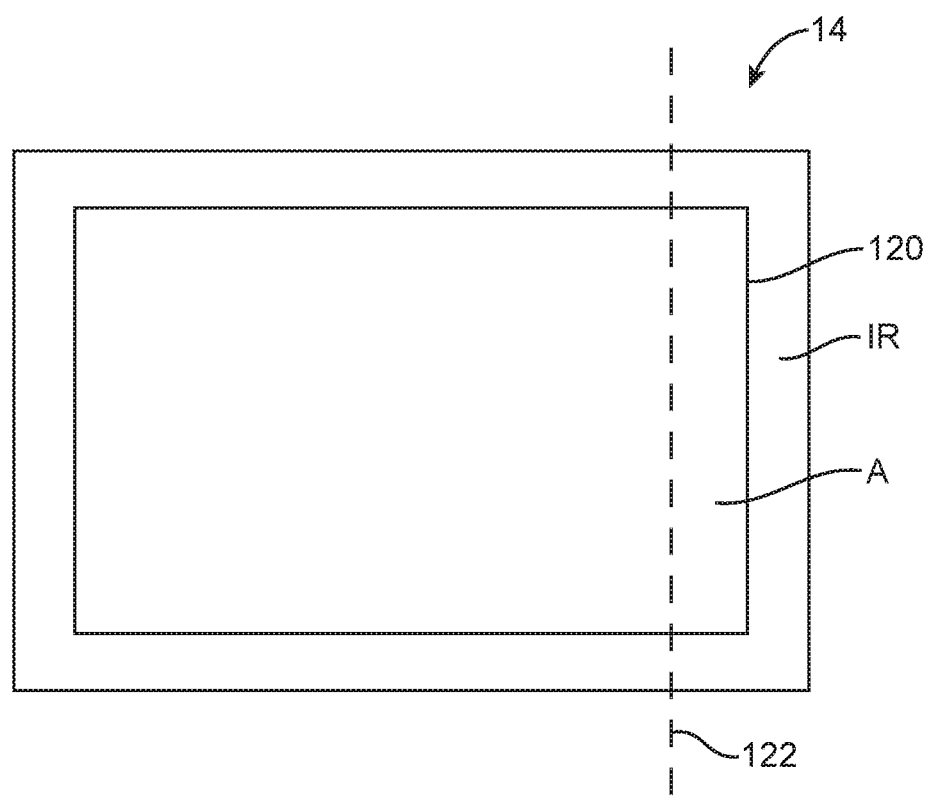
FIG. 33 is a top view of an illustrative touch screen display having a central active region of display pixels surrounded by an inactive peripheral edge region in accordance with an embodiment of the present invention.
Figure 34:
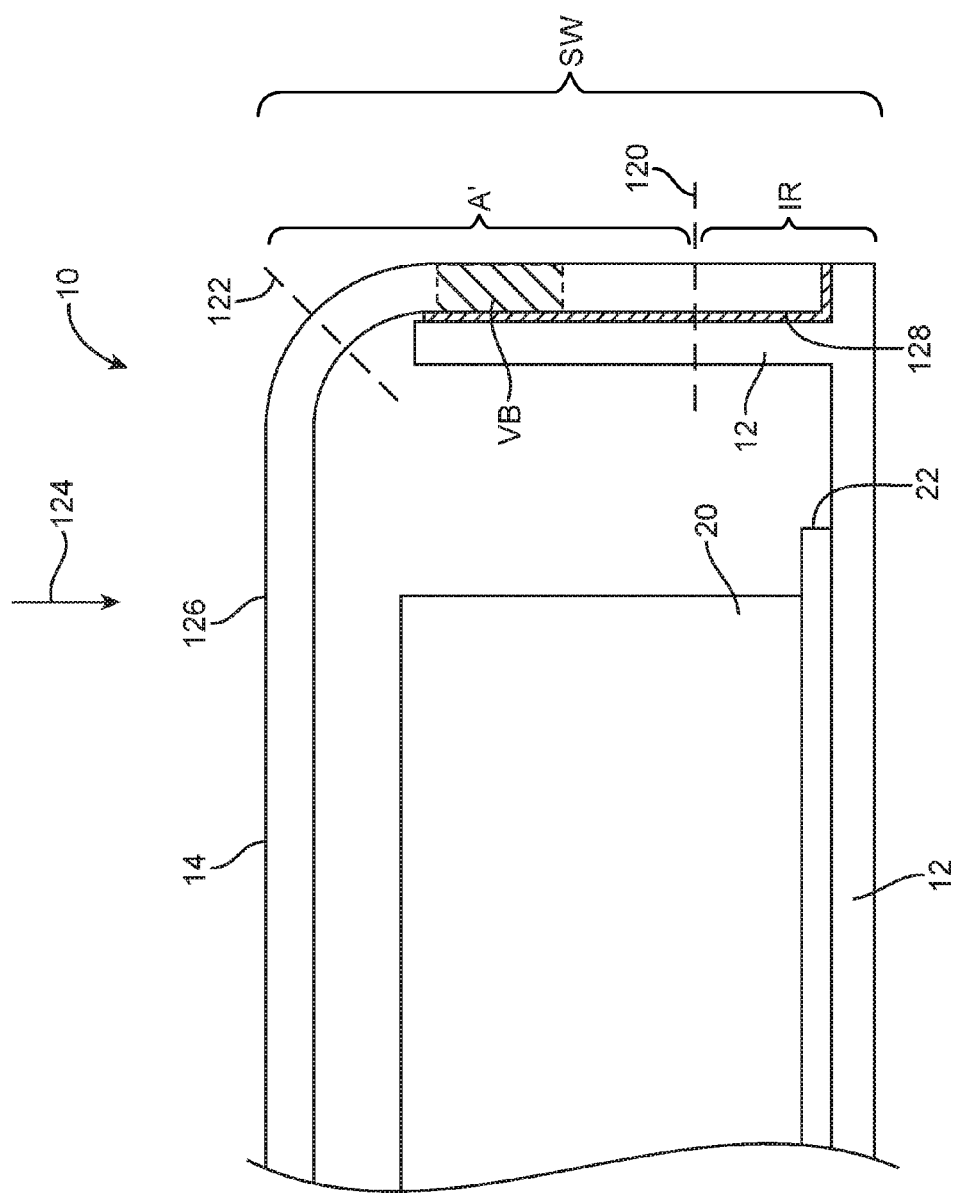
FIG. 34 is a cross-sectional side view of a display of the type shown in FIG. 34 that has been bent along its edge to form a sidewall portion in an electronic device in accordance with an embodiment of the present invention.

As shown in the top view of display 14 of FIG. 33, display 14 may have an inactive border region IR that surrounds periphery 120 of rectangular active central region A. To provide device 10 with borderless display surface (i.e., display structures on its front face that have no inactive region), it may be desirable to bend the edges of display 14 along bend lines such as bend line 122 of FIG. 33. Bend line 122 is located within active area A. As a result, when display 14 is viewed from the side following bending of the layers of display 14 along bend line 122 (e.g., bending of 45° or more, 70° or more, or 90° or more), all of inactive region IR will be located along the sidewall region SW of device 10 and device housing 12, as shown in FIG. 34. By bending one or more of the edges of display 14 along bend lines 122 (and, if desired, by notching out appropriate portions at the corners of display 14 to facilitate bending), display 14 may appear borderless when top (front) surface 126 of device 10 is viewed from direction 124 (FIG. 34).

In the example of FIG. 34, the edge of display 14 (e.g., an OLED display with integrated touch sensors) has been folded over the side of housing structure 12 in device 10, so that portion A' of display active region A and inactive display portion IR reside along sidewall SW of device 10. Adhesive 128 or other suitable attachment mechanisms may be used to attach the bent edge of display 14 to sidewall SW of device 10. The arrangement of FIG. 34 is merely illustrative. Moreover, the sidewall of device 10 need not be planar and need not be perpendicular to front surface 126. The illustrative configuration of FIG. 34 in which surface 126 is horizontal and planar and in which sidewall SW and the overlapping bent edge portions of display 14 are vertical and planar is presented as an example. During operation, device 10 may operate display 14 so that images are displayed substantially on front surface 126 (i.e., by illuminating pixels on the front surface of display 14 without illuminating pixels in portions of display 14 that are located in region A' of active region A, so that region A' is black).

As shown in FIG. 34, on-screen options such as virtual button VB may be presented in the active portion A' of active region A that is folded over to cover sidewall SW. Virtual button VB may, as an example, contain an image of a button or option (e.g., a square button shaped option, etc.). When a user touches virtual button VB, storage and processing circuitry 28 can take suitable action. As examples, contact between a user's finger or other external object and virtual button VB may direct device 10 to take actions such as displaying information for a user, making a volume adjustment to media that is being played to the user, controlling media playback, taking an action associated with a wireless communications session, or otherwise taking suitable action.

One or more virtual buttons such as virtual button VB may be used to form volume adjustment switches (e.g., sliding controls), ringer buttons, on/off buttons, sleep buttons, customized buttons (e.g., buttons that are specific to a particular program or operating system that is running on device 10 and that change in real time during use of device 10), etc. If desired, virtual buttons may be labeled with particular colors, patterns, icons, text, or other information to assist a user in identifying the function of the button. Portions of section A' of display 14 may also be used solely as output devices (e.g., to form status indicators for playback volume, device power state, incoming call notification, application status, or other information).

Buttons may be reconfigured during use of device 10. For example, device 10 may use region A' to display a first set of buttons when operated in one mode and may use region A' to display a second (different) set of buttons when operated in another mode. Options such as option VB may extend partially around the front of device 10 (e.g., to meet up with an option displayed on front surface 126) or may be confined exclusively to the sidewall surface of device 10.

Figure 35:
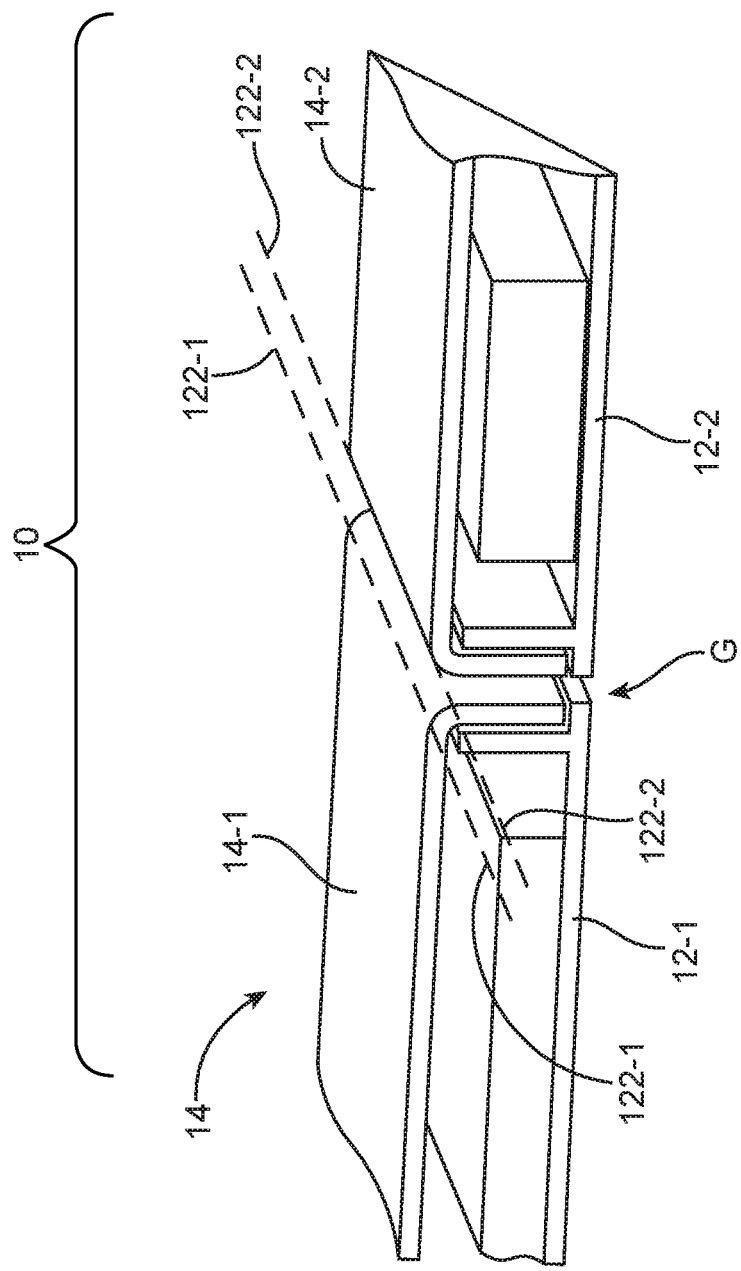
FIG. 35 is a perspective view of an electronic device showing how the electronic device may have a display formed from two sections each having a bent sidewall edge structure of the type shown in FIG. 34 in accordance with an embodiment of the present invention.

As shown in FIG. 35, device 10 may have sections that are joined along respective display bend lines. As shown in FIG. 35, device 10 may have a first portion with first housing 12-1 and first display 14-1. First display 14-1 may be bent downwards along the sidewall of first housing 12-1 at bend line 122-1. Device 10 may also have a second portion with second housing 12-2 and second display 14-2. Second display 14-2 may be bent downwards along the sidewall of second housing 12-2 at bend line 122-2. When assembled into device 10, displays 14-1 and 14-2 may be joined along a thin or essentially zero-width gap G. Because displays 14-1 and 14-2 are borderless, device 10 may use displays 14-1 and 14-2 as a unified display 14. Housings such as housings 12-1 and 12-2 may be joined using additional housing structures, adhesive, fasteners, or other attachment mechanisms or a unitary housing may be formed in which multiple borderless displays such as displays 14-1 and 14-2 are mounted.

The foregoing is merely illustrative of the principles of this invention and various modifications can be made by those skilled in the art without departing from the scope and spirit of the invention. The foregoing embodiments may be implemented individually or in any combination.

What is claimed is:

1. A display, comprising:
   an array of organic light-emitting diodes;
   a polarizer having opposing upper and lower surfaces, wherein the lower surface is closer to the array of organic light-emitting diodes than the upper surface;
   capacitive touch sensor electrodes attached to the upper surface of the polarizer, wherein the upper surface is interposed between the lower surface and the capacitive touch sensor electrodes; and one or more additional capacitive touch sensor electrodes attached to the lower surface of the polarizer, wherein the polarizer is interposed between the capacitive touch sensor electrodes and the additional capacitive touch sensor electrodes.

2. The display defined in claim 1 further comprising:

a thin-film encapsulation layer that encapsulates the organic light-emitting diodes; and a layer of adhesive interposed between the one or more additional capacitive touch sensor electrodes and the thin-film encapsulation layer.

3. The display defined in claim 1 further comprising:

control lines that are coupled to the organic light-emitting diodes; and display and touch sensor control circuitry that is configured to generate control signals that are conveyed over the control lines to the organic light-emitting diodes and that is configured to gather touch sensor capacitance signals from the capacitive touch sensor electrodes on the upper surface of the polarizer and from at least some of the control lines.

4. The display defined in claim 3 wherein the capacitive touch sensor electrodes comprise transparent conductive material and wherein the control lines comprise metal.

5. The display defined in claim 1 further comprising a cover glass layer and a layer of adhesive interposed between the capacitive touch sensor electrodes on the upper surface of the polarizer and the cover glass layer.

6. A display, comprising:

an array of organic light-emitting diodes;

a polarizer having opposing upper and lower surfaces, wherein the lower surface is closer to the array than the upper surface;

a touch sensor panel having capacitive touch sensor electrodes formed on a planar dielectric substrate;

a layer of adhesive with which the touch sensor panel is attached to the polarizer, wherein the upper surface of the polarizer is interposed between the lower surface of the polarizer and the capacitive touch sensor electrodes; and one or more additional capacitive touch sensor electrodes attached to the lower surface of the polarizer, wherein the polarizer is interposed between the capacitive touch sensor electrodes and the additional capacitive touch sensor electrodes.

7. The display defined in claim 6 wherein the layer of adhesive is interposed between the upper surface of the polarizer and the touch senor panel.

8. The display defined in claim 7 wherein the capacitive touch sensor electrodes are formed on a single surface of the planar dielectric substrate in the touch sensor panel.

9. The display defined in claim 6 wherein the capacitive touch sensor electrodes are formed on a single surface of the planar dielectric substrate in the touch sensor panel.

10. A display, comprising:

an array of light-emitting diodes;

an encapsulation layer that encapsulates the light-emitting diodes;

a transparent cover layer;

a polarizer having opposing upper and lower surfaces;

first and second capacitive touch sensor electrodes attached to the upper and lower surfaces of the polarizer, respectively, wherein the polarizer is interposed between the first and second capacitive touch sensor electrodes;

a first layer of adhesive that attaches the polarizer and the first and second capacitive touch sensor electrodes to the transparent cover layer; and a second layer of adhesive that attaches the polarizer layer and the first and second capacitive touch sensor electrodes to the encapsulation layer.

11. The display defined in claim 10 further comprising:

control lines that provide control signals to the light-emitting diodes and that gather capacitive touch sensor measurements from the first and second capacitive touch sensor electrodes.

12. The display defined in claim 11 further comprising:

black masking material interposed between the transparent cover layer and the first and second capacitive touch sensor electrodes on the polarizer layer, wherein the black masking material comprises openings that are aligned with the light-emitting diodes.

* * * * *